United States Patent
Takizawa et al.

(10) Patent No.: US 8,816,366 B2
(45) Date of Patent: Aug. 26, 2014

(54) NITRIDE SEMICONDUCTOR DEVICE

(75) Inventors: Toshiyuki Takizawa, Kyoto (JP); Tetsuzo Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 494 days.

(21) Appl. No.: 13/105,337

(22) Filed: May 11, 2011

(65) Prior Publication Data

US 2011/0211607 A1    Sep. 1, 2011

Related U.S. Application Data

(63) Continuation of application No. PCT/JP2009/005969, filed on Nov. 10, 2009.

(30) Foreign Application Priority Data

Nov. 13, 2008    (JP) .................................. 2008-291544

(51) Int. Cl.

| H01L 33/02 | (2010.01) |
| H01L 21/02 | (2006.01) |
| B82Y 20/00 | (2011.01) |
| H01L 33/32 | (2010.01) |
| H01S 5/32 | (2006.01) |
| H01S 5/223 | (2006.01) |
| H01L 33/24 | (2010.01) |
| H01L 33/16 | (2010.01) |
| H01S 5/20 | (2006.01) |
| H01S 5/343 | (2006.01) |

(52) U.S. Cl.
CPC ...... *H01L 21/0262* (2013.01); *H01L 21/02587* (2013.01); *H01L 21/02381* (2013.01); *H01S 5/3202* (2013.01); *H01S 5/2237* (2013.01); *H01L 21/02458* (2013.01); *B82Y 20/00* (2013.01); *H01L 21/0254* (2013.01); *H01L 21/02636* (2013.01); *H01S 5/3216* (2013.01); *H01L 33/24* (2013.01); *H01L 21/02609* (2013.01); *H01L 21/0242* (2013.01); *H01L 21/02433* (2013.01); *H01L 21/02516* (2013.01); *H01L 33/16* (2013.01); *H01S 5/2009* (2013.01); *H01S 5/34333* (2013.01); *H01L 33/32* (2013.01); *H01L 21/02494* (2013.01); *H01S 2304/04* (2013.01)

USPC .................. 257/94; 438/22; 438/29; 438/34; 438/507; 438/47

(58) Field of Classification Search
USPC ........................ 257/94, E33.013, 103, 98, 76
See application file for complete search history.

(56) References Cited

U.S. PATENT DOCUMENTS

| 7,205,168 | B2 | 4/2007 | Oohata et al. |
| 7,564,064 | B2 | 7/2009 | Oohata et al. |
| 7,893,424 | B2 | 2/2011 | Eichler et al. |
| 2003/0010983 | A1 * | 1/2003 | Ohbo et al. ...................... 257/76 |
| 2004/0266043 | A1 | 12/2004 | Oohata et al. |
| 2006/0237709 | A1 * | 10/2006 | Lee et al. .......................... 257/11 |
| 2007/0147453 | A1 | 6/2007 | Oohata et al. |
| 2008/0054247 | A1 | 3/2008 | Eichler et al. |
| 2009/0095973 | A1 * | 4/2009 | Tanaka et al. ................... 257/99 |

FOREIGN PATENT DOCUMENTS

| JP | 2003-179311 | 6/2003 |
| JP | 2003-218468 | 7/2003 |
| JP | 2008-034851 | 2/2008 |
| JP | 2008-277867 | 11/2008 |
| WO | WO 2004/023569 A1 | 3/2004 |

OTHER PUBLICATIONS

Gako Araki et al, "Metal-Organic Vapor Phase Epitaxy of GaN and InGaN Using Triethylamine with Ammonia as a Nitrogen Source", Japanese Journal of Applied Physics, May 25, 2008, vol. 47, No. 5, Issue 1, pp. 3438-3440.

Barbara Neubert et al, "GaInN quantum wells grown on facets of selectively grown GaN stripes", Applied Physics Letters 87, 182111(2005), American Institute of Physics, Oct. 2005.

* cited by examiner

*Primary Examiner* — Chuong A Luu
*Assistant Examiner* — Rodolfo Fortich

(74) *Attorney, Agent, or Firm* — McDermott Will & Emery LLP

(57) ABSTRACT

An object of the present invention is to provide a nitride semiconductor device which shifts a luminescence wavelength toward a longer wavelength side without decreasing luminescence efficiency, and the nitride semiconductor device according to an implementation of the present invention includes: a GaN layer having a (0001) plane and a plane other than the (0001) plane; and an InGaN layer which contacts the GaN layer and includes indium, and the InGaN layer has a higher indium composition ratio in a portion that contacts the plane other than the (0001) plane than in a portion that contacts the (0001) plane.

9 Claims, 14 Drawing Sheets

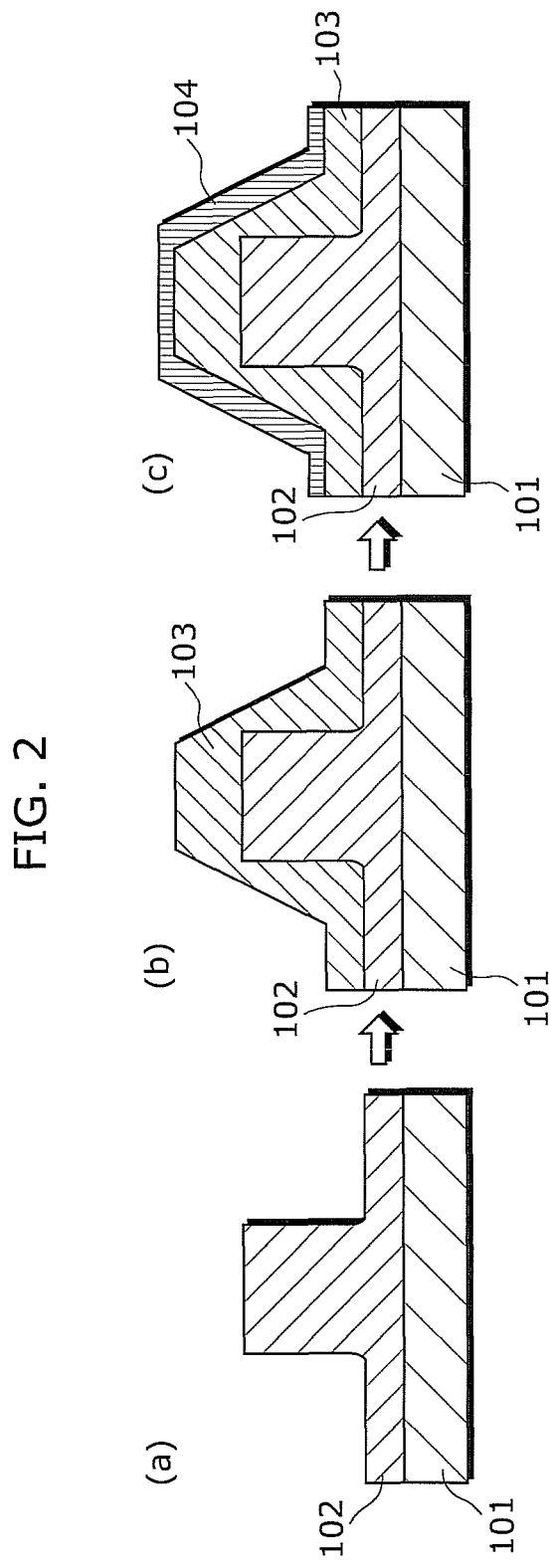

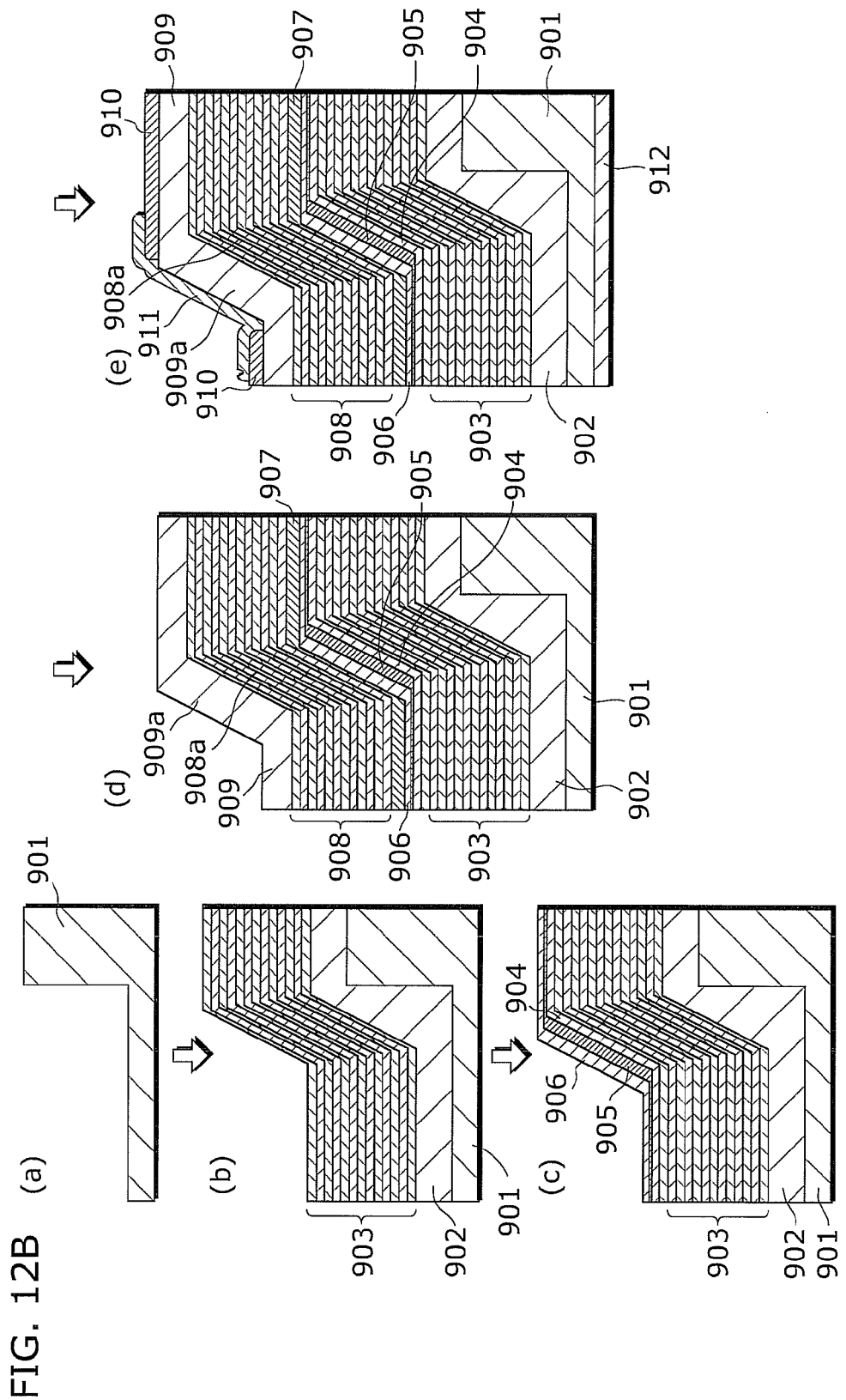

NITRIDE SEMICONDUCTOR DEVICE

CROSS REFERENCE TO RELATED APPLICATION

This is a continuation application of PCT application No. PCT/JP2009/005969 filed on Nov. 10, 2009, designating the United States of America.

BACKGROUND OF THE INVENTION (1) Field of the Invention

The present invention relates to a nitride semiconductor device, and particularly relates to a nitride light-emitting device.

(2) Description of the Related Art

Recently, light-emitting devices have been practically applied as a device using a nitride semiconductor (nitride semiconductor device). As such light-emitting devices, various types of high-brightness light-emitting diodes have been mass-produced to be applied as light sources for outdoor displays, car headlamps, indoor illumination, and so on. Likewise, semiconductor laser elements as light-emitting devices are often used as light sources for large-capacity disk storage devices. Particularly, the nitride semiconductor, which is a GaN-based material, is used for a high-brightness blue light-emitting diode or a blue-violate semiconductor laser element because it is possible to control a luminescence wavelength by adding indium (In) to GaN.

Normally, the nitride semiconductor light-emitting device is manufactured through various processes after epitaxially growing a luminescent layer including InGaN in a (0001) plane of the nitride semiconductor (see Non-Patent Reference 1: Barbara Neubert, and other two authors, "GaInN quantum wells grown on facets of selectively grown GaN stripes", APPLIED PHYSICS LETTERS 87,182111(2005), American Institute of Physics). Normally, ammonia ($NH_3$) is used as a nitrogen source for epitaxial growth. When using $NH_3$ as the nitrogen source, an indium composition in InGaN is highest in the (0001) plane, and this effect has an advantage for shifting the luminescence wavelength toward a longer wavelength side. In addition, in recent years, a technique of epitaxially growing InGaN in a plane direction other than the (0001) plane has been actively developed.

SUMMARY OF THE INVENTION

However, in a conventional nitride semiconductor light-emitting device, when epitaxially growing, above the (0001) plane, the active layer made of a nitride semiconductor including indium so as to shift the luminescence wavelength toward a longer wavelength side, polarization that occurs in a <0001> direction in the nitride semiconductor is so significant that the indium composition of the luminescent layer increases as the polarization increases. As a result, electrons and holes within a quantum well are spatially separated, thus causing a problem of decreasing luminescence efficiency of the luminescent layer.

On the other hand, in the case of forming the luminescent layer above the plane of the plane direction other than the (0001) plane, such as a (1-101) plane, it is possible to obtain high luminescence efficiency due to less polarization occurring even when the indium composition of the luminescent layer is increased. However, in the case of forming the luminescent layer above the plane other than the (0001) plane, due to extremely low efficiency in indium incorporation, it is difficult to obtain a luminescent layer that shifts the luminescence wavelength toward a longer wavelength side and becomes luminescent at a visible light wavelength.

In addition, at present, a substrate having a plane direction other than the (0001) plane has small area and is extremely expensive. Thus, another technique has been developed which is to expose, using etching process and growth anisotropy, a plane other than the (0001) plane on GaN having the (0001) plane as a main surface, and form the luminescent layer thereon. However, when growing the luminescent layer above the plane other than the (0001) plane, since indium is preferentially incorporated into the (0001) plane adjacent to the plane other than the (0001) plane, it has not been achieved yet to obtain high-quality InGaN which becomes luminescent at a visible light wavelength range.

Thus, an object of the present invention, in view of such problems, is to provide a nitride semiconductor device that shifts the luminescence wavelength toward a longer wavelength side without decreasing luminescence efficiency.

To break such constraints on the epitaxial growth of the nitride semiconductor including In, the inventors have conducted an experiment of epitaxial growth of the nitride semiconductor, in which triethylamine is concomitantly used for a nitrogen source gas. As a result, it has been proved that indium incorporation efficiency dramatically increased in the plane direction other than the (0001) plane as compared to the case of using only the nitrogen source gas. This finding has led us to the present invention.

To achieve the above object, a nitride semiconductor device according to an aspect of the present invention includes: a first nitride semiconductor including a (0001) plane and a plane other than the (0001) plane; and a second nitride semiconductor that contacts the first nitride semiconductor and includes indium, and the second nitride semiconductor has a higher indium composition ratio in a portion that contacts the plane other than the (0001) plane than in a portion that contacts the (0001) plane.

When epitaxially growing the nitride semiconductor concomitantly using triethylamine for the nitrogen source gas, the indium composition is higher above the plane that is other than the (0001) plane than above the plane (0001). Accordingly, this indicates that in the nitride semiconductor device having the structure above, the second nitride semiconductor is formed using triethylamine. Since this forms the nitride semiconductor having a high indium composition above the plane that is other than the (0001) plane and with less polarization, it is possible to realize a nitride semiconductor device which allows shifting the luminescence wavelength toward a longer wavelength side without decreasing luminescence efficiency.

In addition, the second nitride semiconductor may have a greater thickness in the portion that contacts the plane other than the (0001) plane than in the portion that contacts the (0001) plane.

When epitaxially growing the nitride semiconductor concomitantly using triethylamine for the nitrogen source gas, the nitride semiconductor has a greater film thickness above the plane other than the (0001) plane than above the (0001) plane. Accordingly, it is proved that in the nitride semiconductor device having the structure as described above, the second nitride semiconductor is formed using triethylamine. This forms a nitride semiconductor having a high indium composition above the plane that is other than the (0001) plane and with polarization, thus making it possible to realize a nitride semiconductor device which allows shifting the luminescence wavelength toward a longer wavelength side without decreasing luminescence efficiency.

In addition, the plane other than the (0001) plane may be one of a (1-101) plane, a (11-22) plane, a (1-102) plane, and a (11-24) plane.

When epitaxially growing the nitride semiconductor on the substrate after etching the (0001) plane of the substrate to form asperity, a plane having the plane direction as described above is automatically formed according to the epitaxial growth condition. For example, under an epitaxial growth condition of high temperature and low ammonium flow ratio, a (1-101) plane is automatically formed. Accordingly, it is possible to selectively expose a particular plane direction on the nitride semiconductor, irrespective of the plane direction exposed on the substrate as a result of etching. Since this does not require high controllability over etching shape, it is possible to realize a low-cost nitride semiconductor device.

In addition, the nitride semiconductor device may be a light-emitting device including the second nitride semiconductor as a luminescent layer.

With the configuration described above, providing nitride semiconductors having different conductivities from each other on and under the second nitride semiconductor allows introducing electrons and holes from the nitride semiconductors on and under into the luminescent layer, thus making it possible to realize a light-emitting device having high luminosity and reliability.

In addition, the third nitride semiconductor may have a higher carbon concentration in the portion located above the plane other than the (0001) plane than in the portion located above the (0001) plane.

The configuration above allows the third nitride semiconductor above a plane other than the (0001) plane to efficiently incorporate carbon into a nitrogen site. On the other hand, the third nitride semiconductor above the (0001) plane has poor site controllability. In other words, since the third nitride semiconductor becomes a highly-concentrated p-type region only in an area above the plane other than the (0001) plane, it is possible to form, in one epitaxial growth, a current narrowing structure along with forming the p-type region. As a result, it is possible to realize a highly efficient and high-brightness laser element.

In addition, the nitride semiconductor device may further include a third nitride semiconductor including aluminum and provided either opposite to the first nitride semiconductor with respect to the second nitride semiconductor or opposite to the second nitride semiconductor with respect to the first nitride semiconductor, and the third nitride semiconductor may have a greater thickness in a portion located above the (0001) plane than in a portion located above the plane other than the (0001) plane.

The configuration above allows reducing a current path that runs through the third nitride semiconductor above the (0001) plane, thus allowing the third nitride semiconductor to function as a current blocking layer. Accordingly, it is possible to realize a highly efficient and high-brightness laser element.

In addition, the light-emitting device may be a laser element, and the third nitride semiconductor may be a periodic structure in which a plurality of layers including aluminum are periodically stacked, and the periodic structure of the third nitride semiconductor may have a longer period in the portion located above the (0001) plane than in the portion located above the plane other than the (0001) plane.

With the configuration above, in the third nitride semiconductor, the current path in the <0001> direction narrows. On the other hand, the current path into the (0001) plane widens by polarization effect. Accordingly, in the third semiconductor, a horizontal flow of current is directed into the active layer having a high indium composition. Since, as a result, this allows effectively narrowing the current, it is possible to realize a highly efficient and high-brightness laser element.

In addition, the periodic structure may include a layer having an aluminum content below 1%.

With the configuration above, it is particularly possible to reduce dislocation and distortion significantly with respect to the (1-101) plane, thus making it possible to realize a highly efficient and high-brightness laser element.

In addition, the second semiconductor may have conductivity, and the nitride semiconductor device further may include an electrode provided on and in contact with the second nitride semiconductor.

In the configuration above, the second nitride semiconductor functions as a contact layer with the electrode. The second nitride semiconductor, even though the impurity concentration is at the same level across the second nitride semiconductor, has a higher indium composition and a narrower bandgap in the plane other than the (0001) plane, so that impurity activation energy decreases in the plane other than the (0001) plane, thus resulting in a high career concentration. As a result, it is possible to realize a nitride semiconductor device with lower power consumption.

In addition, a method of manufacturing a nitride semiconductor device according to an aspect of the present invention may also include epitaxially growing, using a gas, a nitride semiconductor including indium above a plane other than a (0001) plane of the nitride semiconductor, the gas including nitrogen and indium and additionally including triethylamine.

In the configuration above, since it is possible to form the nitride semiconductor having a high indium composition above the plane other than the (0001) plane, it is possible to realize a nitride semiconductor device which allows shifting the luminescence wavelength toward a longer wavelength side without decreasing luminescence efficiency.

In addition, the method of manufacturing a nitride semiconductor device may further include epitaxially growing a nitride semiconductor using a gas not additionally including triethylamine, and the nitride semiconductor that is epitaxially grown using the gas additionally including triethylamine may be either higher in carbon concentration or lower in hydrogen concentration than the nitride semiconductor that is epitaxially grown using the gas not additionally including triethylamine.

Since increase in carbon content suppresses hydrogen movement within the nitride semiconductor, it is possible to realize a reliable nitride semiconductor device. In addition, since decrease in hydrogen content efficiently suppresses hydrogen diffusion into the active layer and so on, it is possible to realize a semiconductor device which becomes luminescent at constant operation voltage.

According to an implementation of the present invention, it is possible to realize a nitride semiconductor device which has high luminescence efficiency and becomes luminescent at a visible light range, without using an expensive substrate having a plane direction other than the (0001) plane or without complicating the manufacturing process. In addition, it is possible realize a highly-reliable nitride semiconductor device which operates at low operation voltage.

FURTHER INFORMATION ABOUT TECHNICAL BACKGROUND TO THIS APPLICATION

The disclosure of Japanese Patent Application No. 2008-291544 filed on Nov. 13, 2008, including specification, drawings and claims is incorporated herein by reference in its entirety.

The disclosure of PCT application No. PCT/JP2009/005969 filed on Nov. 10, 2009, including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 2 is a cross-sectional view for describing a method of manufacturing the nitride semiconductor device;

FIG. 12B is a cross-sectional view for describing a method of manufacturing the nitride semiconductor laser element.

DESCRIPTION OF THE PREFERRED EMBODIMENTS

Hereinafter, a nitride semiconductor device according to an embodiment of the present invention will be described with reference to the drawings.

Figure 1:
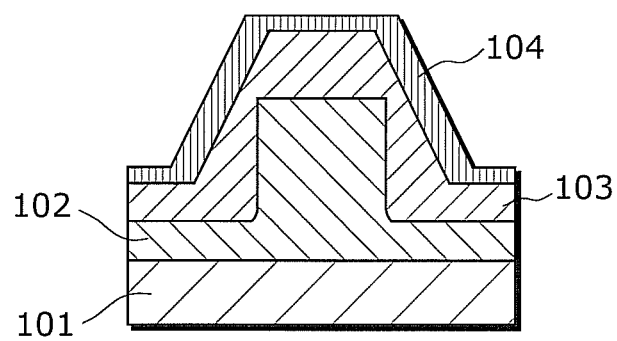
FIG. 1 is a cross-sectional view showing a configuration of a nitride semiconductor device according to an embodiment of the present invention.

FIG. 1 is a cross-sectional view showing a configuration of the nitride semiconductor device according to the present embodiment.

The nitride semiconductor device includes: a sapphire substrate 101, a GaN layer 102, a GaN layer 103, and an InGaN layer 104.

The sapphire substrate 101 has a (0001) plane as a main surface, and the GaN layer 102 is provided on and in contact with the (0001) plane. The GaN layer 102 includes, in the surface, a convex portion (mesa) having a mesa height of, for example, approximately 2.5 µm, and in the GaN layer 102, a top surface of the convex portion and a surface of a portion other than the convex portion are (0001) plane.

The GaN layer 103 is an example of a first nitride semiconductor according to an implementation of the present invention, and is provided, to cover the convex portion of the GaN layer 102, on and in contact with an entire surface of the GaN layer 102 including the convex portion. The GaN layer 103 has a convex portion in the surface, reflecting a surface shape of the GaN layer 102. In the GaN layer 103, the top surface of the convex portion and a surface of a portion other than the convex portion are (0001) plane, and a slope as a lateral surface of the convex portion is (1-101) plane. Thus, the GaN layer 103 includes the (0001) plane and the (1-101) plane that is a plane other than the (0001) plane.

The InGaN layer 104 is an example of a second nitride semiconductor according to an implementation of the present invention, and is provided, to cover the convex portion of the GaN layer 103, on and in contact with an entire surface of the GaN layer 103 including the convex portion. The InGaN layer 104 includes indium, and has a higher indium composition ratio in a portion that is grown in a <1-101> direction, that is, the portion that contacts the (1-101) plane of the GaN layer 103, than in a portion that is grown in the <0001> direction, that is, the portion that contacts the (0001) plane of the GaN layer 103.

The InGaN layer 104 has a greater thickness in the <1-101> direction in the portion that contacts the (1-101) plane of the GaN layer 103 than in the <0001> direction in the portion that contacts the (0001) plane of the GaN layer 103. Furthermore, the InGaN layer 104 includes carbon as an impurity, and has a higher carbon concentration than the GaN layer 103. Furthermore, the InGaN layer 104 includes hydrogen as an impurity, and has a lower hydrogen concentration than the GaN layer 103.

Next, a method of manufacturing the nitride semiconductor device having the structure above will be described. FIG. 2 is a cross-sectional view for describing the method of manufacturing the nitride semiconductor device.

First, a template substrate is prepared in which the GaN layer 102 is epitaxially grown above the (0001) plane of the sapphire substrate 101. Then, after depositing a $SiO_2$ film on the template substrate, the deposited SiO$_2$ film is patterned using an exposure method and CF$_4$-based reactive ion etching. Furthermore, the pattern of the SiO$_2$ film is transcribed to the GaN layer 102 using a technique of chlorine-based dray etching. Then, the SiO$_2$ film is completely removed using hydrofluoric acid, so as to form a mesa structure as shown in FIG. 2(a) in the GaN layer 102.

Next, after carrying the template substrate into a metal organic chemical vapor deposition (MOCVD) furnace, the GaN layer 103 is epitaxially grown at 1000° C. Here, trimethylgallium (TMG) is used as a gallium (Ga) material, and only NH$_3$ is used as a nitrogen (N) material. In this processing, as shown in FIG. 2(b), due to anisotropy of epitaxial growth of the GaN layer, the (1-101) plane is automatically formed on the lateral surface of the convex portion of the GaN layer 103 that is re-grown.

Next, as shown in FIG. 2(c), the InGaN layer 104 is epitaxially grown above the (0001) plane and (1-101) plane of the GaN layer 103. In epitaxially growing the InGaN layer 104, a growth temperature is set to 800° C., and trimethylindium (TMI) is used as an indium material. As a N material other than NH$_3$, triethylamine (NEt$_3$) is also added. In the case of adding NEt$_3$, a flow ratio of NEt$_3$ with respect to NH$_3$ is set to approximately 2%, and a flow ratio of TMI with respect to a total flow rate of the N-source gas (flow rates of NH$_3$ and NEt$_3$) is set to approximately 80%. It is to be noted that when epitaxially growing the InGaN layer 104 using only NH$_3$ without adding NEt$_3$, an InGaN layer having an indium composition of approximately 9% can be obtained, at which a luminescence wavelength is approximately 405 nm.

Lastly, after termination of the epitaxial growth of the InGaN layer 104, the template substrate is taken out from the MOCVD furnace.

Next, a result of the experiment on the nitride semiconductor device having the structure above will be described.

Figure 3A:
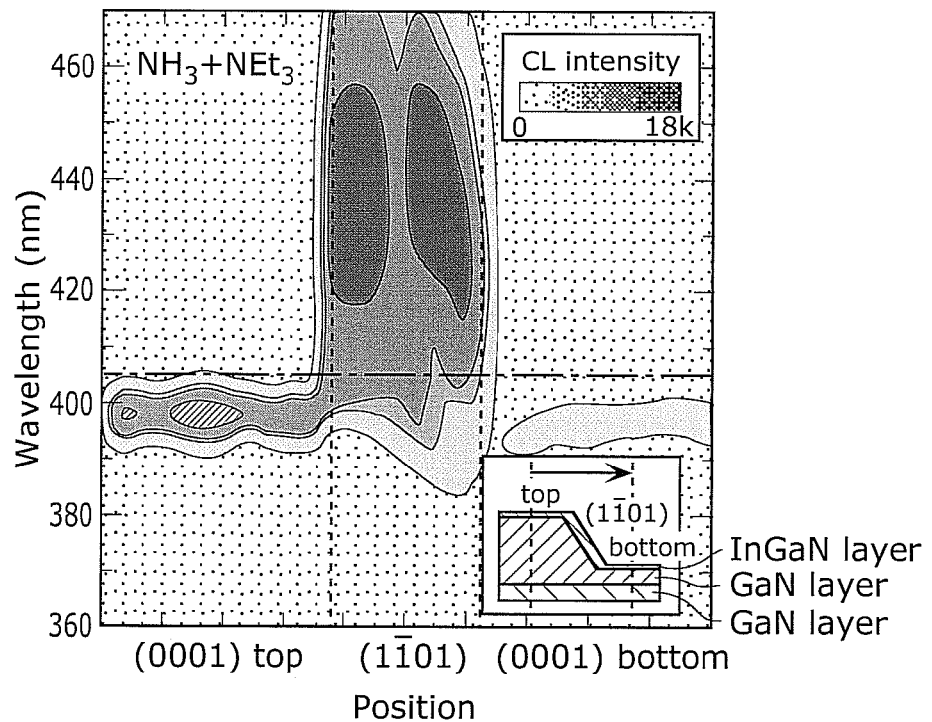
FIG. 3A is a diagram showing a result of measurement by a CL method performed on the nitride semiconductor device according to the embodiment of the present invention.
Figure 3B:
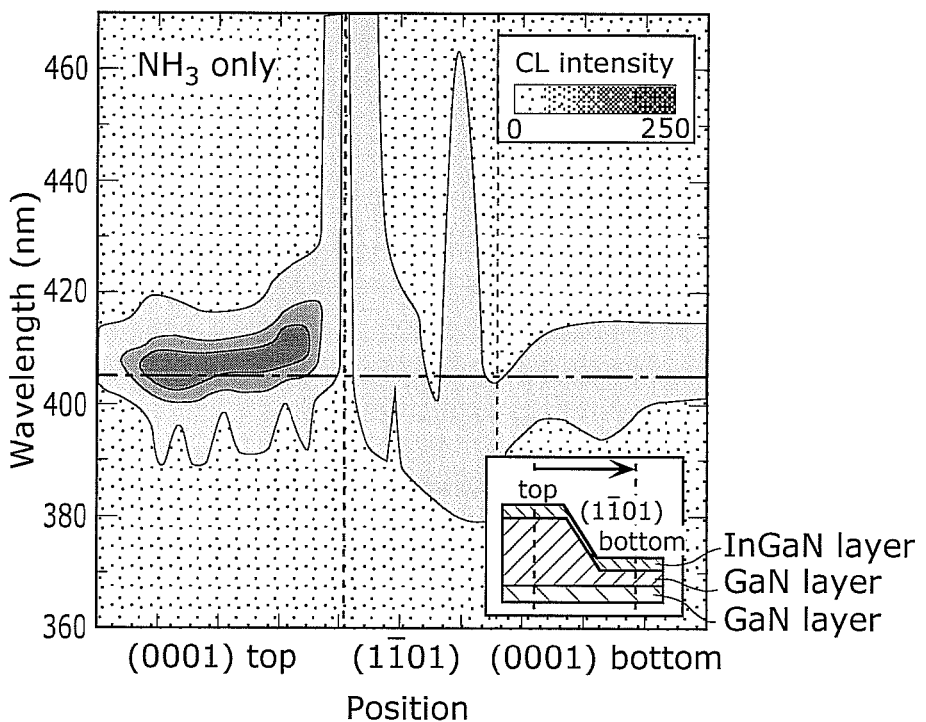
FIG. 3B is a diagram showing a result of measurement by the CL method performed on a conventional nitride semiconductor device.

To examine the amount of indium incorporated into the InGaN layer, a line analysis using the cathode luminescence (CL) method is performed on the nitride semiconductor device. FIGS. 3A and 3B show results of the measurement by the CL method. FIG. 3A is a diagram showing a result of measurement performed on the nitride semiconductor device according to the present embodiment, in which an InGaN layer is formed using NEt$_3$, and FIG. 3B is a diagram showing a result of measurement performed on a conventional nitride semiconductor device in which an InGaN layer is formed without using NEt$_3$. In FIGS. 3A and 3B, a horizontal axis indicates a measurement position, and a vertical axis indicates a luminescence wavelength (a CL luminescence wavelength) observed in the measurement. In addition, a position of measurement by the CL method is indicated by an arrow in a figure inserted in each figure. In FIGS. 3A and 3B, to facilitate viewing, each dashed line indicates, a boundary between each region, which is a boundary, in the InGaN layer, between: an area of (0001) plane in the top surface of the convex portion (represented as (0001) top in the figure), an area of (1-101) plane in the lateral surface of the convex portion (represented as (1-101) in the figure), and an area of (0001) plane which is other than the convex portion (represented as (0001) bottom in the figure), and each dashed-dotted line represents a CL luminescence wavelength (approximately 405 nm) of InGaN included in the conventional nitride semiconductor device.

FIG. 3A shows that: compared to the (0001) top and (0001) bottom, in the (1-101) plane that is a slope, the CL luminescence wavelength is shifted significantly toward a longer wavelength side. The indium composition can be estimated to be 17% from a central wavelength that is approximately 440 nm. On the other hand, at the (0001) top and the (0001) bottom, the luminescence wavelength is little less than 400 nm, and the indium composition can be estimated to be approximately 8%. As described above, a result of the experiment shows that: in the epitaxial growth of the InGaN layer concomitantly using NEt$_3$, the incorporation of indium into the (0001) plane is suppressed, while the incorporation of indium into a non-(0001) plane such as the (1-101) plane is exponentially increased.

On the other hand, in the epitaxial growth of the InGaN layer using only NH$_3$, the indium composition can be estimated to be approximately 9% from the luminescence wavelength of 405 nm at the (0001) top and (0001) bottom, and these are exactly designed values. On the other hand, it is not possible to obtain a sufficient level of luminescence intensity for reading the peak wavelength from the (1-101) plane that is a slope. Non-Patent Reference 1 and so on have shown that, in the epitaxial growth of the InGaN layer using only NH$_3$, an amount of indium incorporation in the (1-101) plane is significantly smaller than in the (0001) plane. In addition, FIG. 3B shows that the luminance wavelength is shifted toward a longer wavelength side at a boundary portion between the (0001) top and (1-101), and it is possible to consider that this is because: indium that is not incorporated into the (1-101) plane is diverted to the (0001) plane, so that the indium composition is locally increased. Thus, it is clear that in the normal epitaxial growth of the InGaN layer using only NH$_3$, the amount of indium incorporation in the (0001) plane is highest.

Comparing FIGS. 3A and 3B, it is shown that the luminescence intensity differs by approximately double digits. A possible reason for this is that the addition of NEt$_3$ has promoted efficient decomposition of NH$_3$ and has allowed obtaining a high-quality InGaN layer with fewer faults. In addition, in both the epitaxial growth of the InGaN layer using only NH$_3$ and the epitaxial growth of the InGaN layer concomitantly using NEt$_3$, the luminescence intensity appears different between the (0001) top and the (0001) bottom, for which the following two reasons can be considered. The first reason is that difference in surface height causes difference in electron beam diameter in the measurement using the CL method, which causes, as a result, difference in luminescence intensity. The other reason is attributed to a step formation process as shown in FIG. 2(a): since the (0001) bottom is engraved, more dislocations occur in the (0001) bottom than in the (0001) top, and this causes difference in luminescence wavelength.

Figure 4:
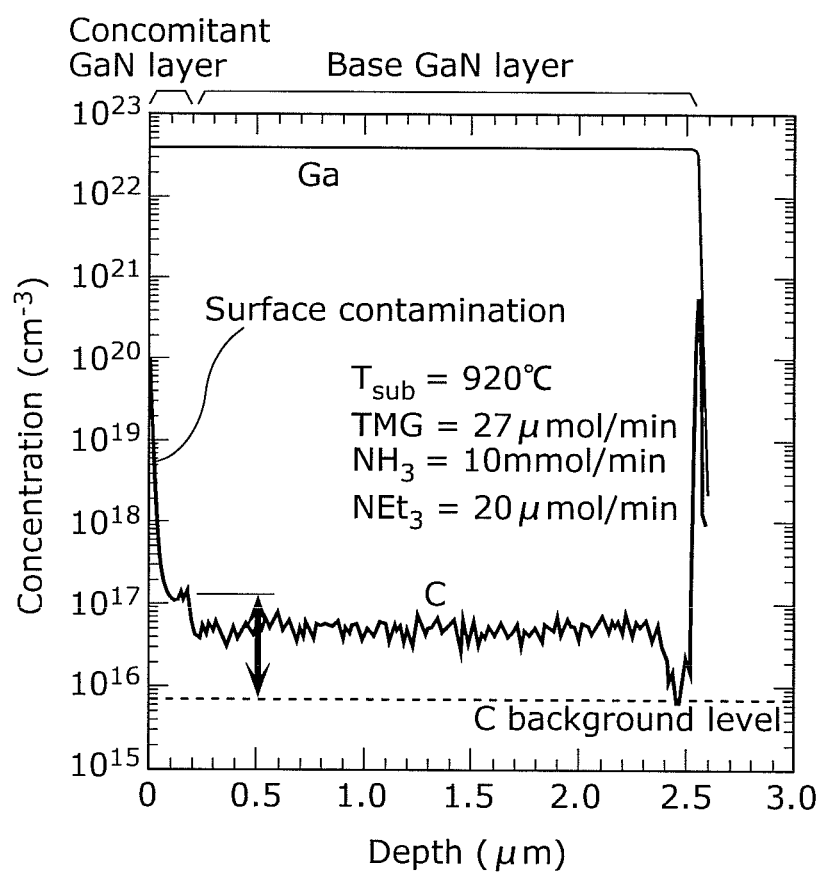
FIG. 4 is a diagram showing a result of a composition analysis by a SIMS method performed on a sample in which a concomitant GaN layer is continuously grown on the base GaN layer.

Here, since NEt$_3$ is a material including 6 carbon atoms, there is a concern about an incorporation of such carbon atoms into the InGaN layer during epitaxial growth. Thus, we have conducted an experiment to check an amount of carbon incorporation into the InGaN layer. FIG. 4 is a diagram showing a result of a composition analysis by a secondary ion mass spectrometry (SIMS) method that is performed on a sample in which a GaN layer (concomitant GaN layer) is continuously grown concomitantly using NEt$_3$, on a GaN layer (base GaN layer) that is epitaxially grown using only NH$_3$. The film thickness of the concomitant GaN layer is approximately 200 nm. It is to be noted that the carbon concentration is high in the surface layer of the sample due to contamination of the surface.

In FIG. 4, the base GaN layer has a carbon concentration at an approximately intermediate level between $10^{16}$ cm$^{-3}$ and $10^{17}$ cm$^{-3}$, while the concomitant GaN layer has a carbon concentration of $10^{17}$ cm$^{-3}$. From the difference between the two concentration values, it can be considered that performing epitaxial growth concomitantly using NEt$_3$ results in carbon incorporation approximately at the intermediate level between $10^{16}$ cm$^{-3}$ and $10^{17}$ cm$^{-3}$. However, the level of carbon incorporation does not seriously affect an application to an optical device at all, and thus it can be considered as being unnecessary to worry about carbon incorporation as a result of the epitaxial growth using NEt$_3$.

Figure 5:
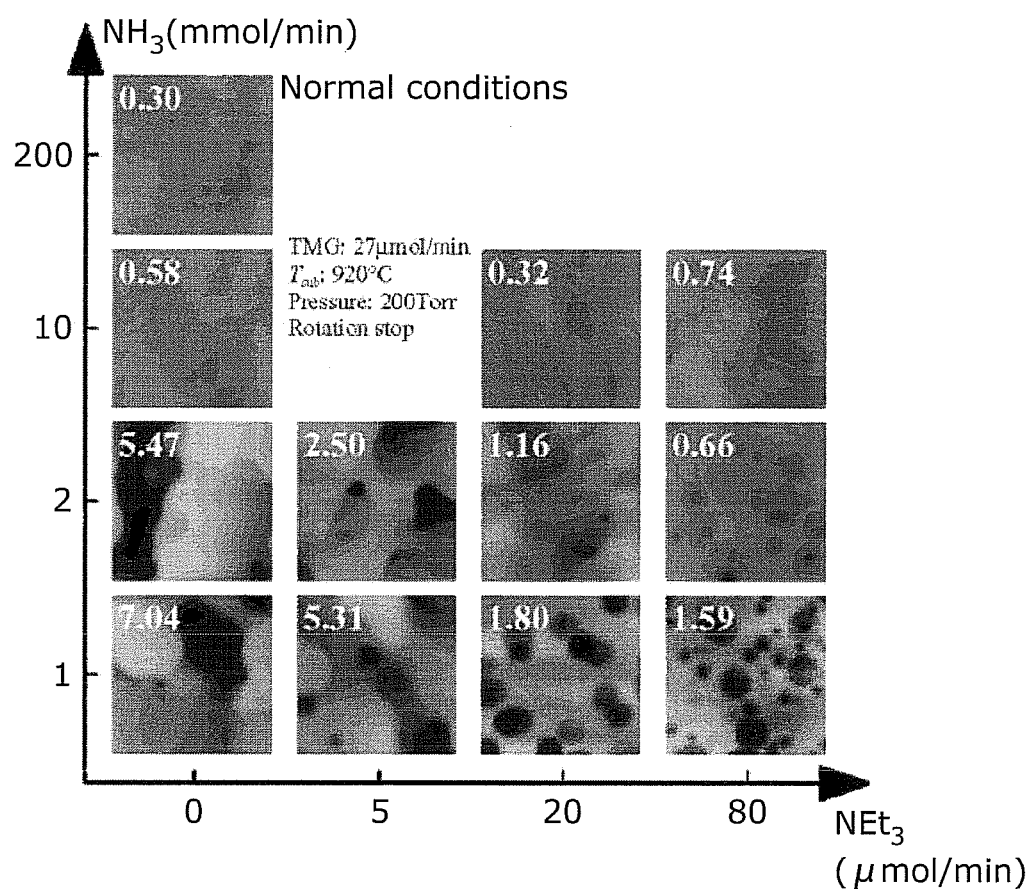
FIG. 5 is a diagram showing a result of an observation by an AFM performed on a surface of the sample in which a GaN layer is epitaxially grown when changing the flow rates of $NH_3$ and $NEt_3$.

In addition, it is observed that the concomitant use of NEt$_3$ produces an advantageous effect of increasing growth rate in the (1-101) plane. In the epitaxial growth of the InGaN layer using only NH$_3$, the growth rate in the (1-101) plane decreases to a fifth of the growth rate in the (0001) plane. In contrast, in the epitaxial growth of the InGaN layer concomitantly using NEt$_3$, the growth rate in the (1-101) plane increases to approximately three or four times the growth rate in the (0001) plane. This tendency is the same with another plane direction such as a (11-22) plane. A clue to a qualitative understanding of the cause is in the case of applying a concomitant use of NEt$_3$ to the epitaxial growth of the GaN layer. Thus, the following will describe a result of an experiment in which the growth method concomitantly using NEt$_3$ is applied to the epitaxial growth of the GaN layer. FIG. 5 is a diagram showing a result of an observation using an atomic force microscope (AFM), which is performed on a surface of a sample in which the GaN layer is epitaxially grown by changing the flow rates of NH$_3$ and NEt$_3$. In the graph in FIG. 5, a vertical axis represents a flow rate of NH$_3$, and a horizontal axis represents a flow rate of NEt$_3$. Then, each image shows a sample surface at a value indicating the flow rates of NH$_3$ and NEt$_3$ represented in graph coordinates. The outline numerals in each image represents, in units of nm, surface roughness of the sample when the image is obtained.

FIG. 5 shows that under a normal condition (a condition in which NH$_3$ flow rate is 180 mmol/min, NEt$_3$ flow rate is 0 μmol/min), the surface of the GaN layer grows into a flat state to have approximately the same roughness as in an atomic layer step. On the other hand, when gradually decreasing only the flow rate of NH$_3$, the surface becomes rougher, and a very large asperity is generated when the flow rate of NH$_3$ is reduced to 2 mmol/min or less. A possible cause of this is that: an insufficient amount of NH$_3$ causes shortage in migration in the surface, which results in slowdown in epitaxial growth toward a lateral side such as the (1-101) plane, and causes increase in surface asperity. On the other hand, by gradually increasing the flow rate of NEt$_3$, the surface roughness is significantly improved particularly at a lower NH$_3$ flow rate. Particularly, when setting the flow rate of NH$_3$ to 10 mmol/min and the flow rate of NEt$_3$ to 20 μmol/min, the surface roughness is improved to a level equivalent to the normal condition.

Thus, due to the possibility of decreasing the flow rate of NH$_3$ by 1 digit or more, and as a result of improvement in decomposition of NH$_3$ by adding NEt$_3$, migration to the lateral surface such as the plane (1-101) is increased, so that surface flatness increases. In our past experiment using dimethylhydrazine (DMHy) as a nitrogen source, we also found out that the GaN layer was not epitaxially grown in the (0001) plane at all but was epitaxially grown preferentially in the lateral surface only. In the normal epitaxial growth using NH$_3$, such a phenomenon does not occur due to a slow rate of growth in the lateral surface. A possible cause of this is that the use of an organic nitrogen source such as NEt$_3$ and DMHy promotes the epitaxial growth toward the lateral surface. Furthermore, when increasing the amount of NEt$_3$ while decreasing the amount of NEt$_3$ at the same time, small pits are observed increasing although surface asperity is significantly improved. A possible cause of this is that NEt$_3$, unable to hit NH$_3$ that is too small in amount, is thermally decomposed, to result in attachment of redundant carbons to the surface.

Figure 6:
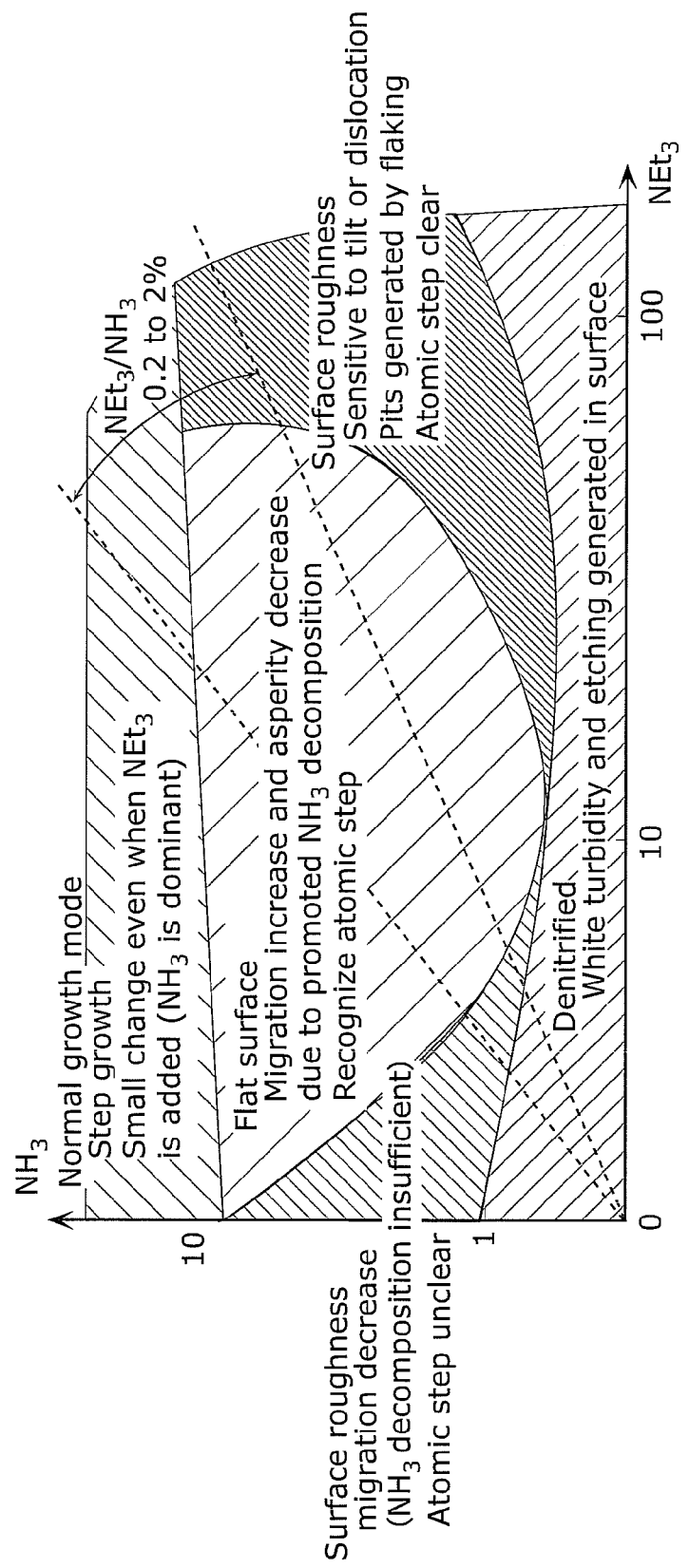
FIG. 6 is a diagram schematically summarizing the result of the AFM observation performed on the GaN layer.

FIG. 6 is a diagram schematically summarizing the result of the experiment on the GaN layer shown in FIG. 5 above. As shown in FIG. 6, under the condition in which the NH$_3$ flow rate is increased, the concomitant use of NEt$_3$ hardly produces an advantageous effect because the thermal decomposition only by NH$_3$ is dominant even when NEt$_3$ is added. On the other hand, when gradually decreasing the flow rate of NH$_3$, the surface becomes rougher. In this processing, by gradually adding the flow rate of NEt$_3$, the decomposition is promoted, thus allowing obtaining a flat surface. By further increasing the flow rate of NEt$_3$, a product of decomposition by redundant NEt$_3$ is attached to the surface, so that roughness increases again. On the other hand, when further decreasing the flow rate of the NH$_3$, the amount of NH$_3$ becomes absolutely scarce, so that denitrification or etching occurs even when NEt$_3$ is added.

Next, to prove that the indium incorporation into the (1-101) plane is promoted, the following experiment is conducted.

Figure 7A:
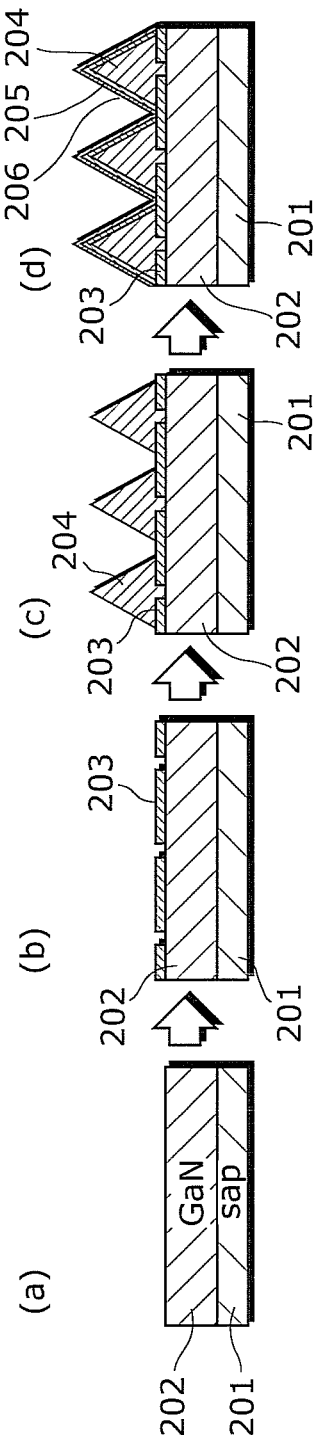
FIG. 7A is a cross-sectional view for describing a method of manufacturing a template substrate as a measurement sample.

First, after a process as shown in FIG. 7A, the template substrate having a serrated structure in the surface is manufactured. Specifically, a substrate is prepared in which the GaN layer 202 is epitaxially grown in the (0001) plane of a sapphire substrate 201 (FIG. 7A(a)). Then, a SiO$_2$ film 203 is formed on the substrate and patterned, so as to form a stripe window (FIG. 7A(b)). The direction of the stripe window coincides with the <11-20> direction. Subsequently, the GaN layer 204 is epitaxially grown only using NH$_3$ (FIG. 7A(c)). In this processing, since the rate of growth toward the lateral surface is slow, the lateral surface including the (1-101) plane is automatically formed. The (0001) plane disappears, and the entire surface is formed of the (1-101) plane. Subsequently, after re-growing the GaN layer 205 on the GaN layer 204, the InGaN layer 206 is epitaxially grown by concomitantly using NEt$_3$ along with NH$_3$, to form the template substrate. It is to be noted that, at the same time, a template substrate for comparison is also prepared in which the InGaN layer 206 is epitaxially grown using only NH$_3$ without concomitantly using NEt$_3$.

Figure 7C:
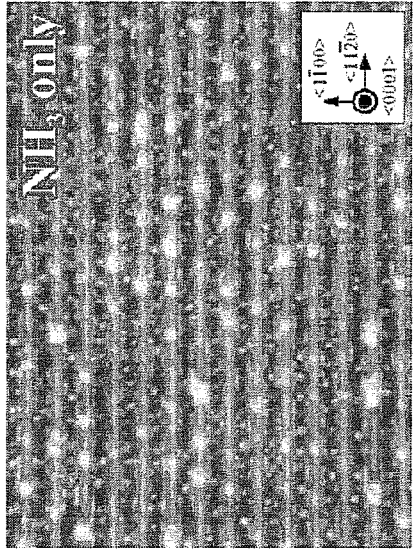
FIG. 7C is a diagram showing an optical microscope image as seen from above a template substrate for comparison.
Figure 7B:
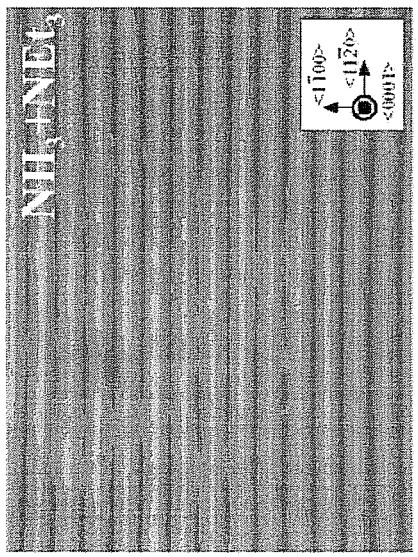
FIG. 7B is a diagram showing an optical microscope image as seen from above the template substrate.

FIGS. 7B and 7C are diagrams showing optical microscope images as seen from above the template substrate manufactured through the process shown in FIG. 7A. Specifically, FIGS. 7B and 7C show, respectively, optical microscope images as seen from above of the template substrate in which the InGaN layer is epitaxially grown concomitantly using NEt$_3$, and of the template substrate for comparison in which the InGaN layer is epitaxially grown using only NH$_3$.

As clearly shown in FIGS. 7B and 7C, in the case of epitaxially growing the InGaN layer concomitantly using NEt$_3$, all the indium is incorporated into the InGaN layer, and no indium droplet having a metal glaze in the surface is deposited. On the other hand, when epitaxially growing the InGaN layer using only NH$_3$, a large amount of indium that is not incorporated into the InGaN layer is deposited in the surface as droplets. Thus, it is shown that in the epitaxial growth of the InGaN layer concomitantly using NEt$_3$, it is possible to epitaxially grow the InGaN layer efficiently even in the (1-101) plane that is normally inefficient in indium incorporation.

Figure 8A:
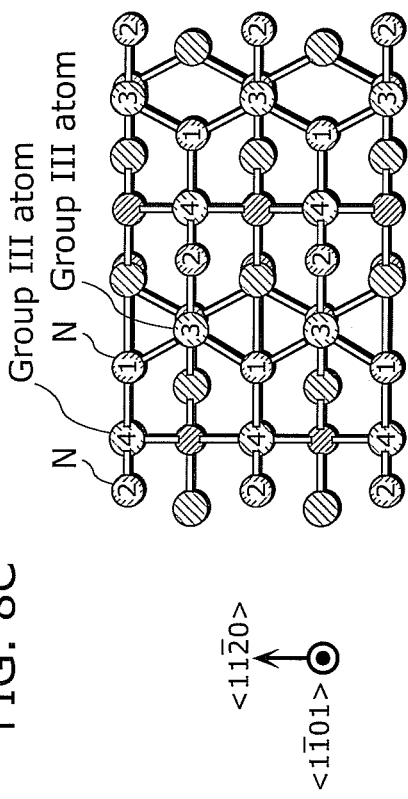
FIG. 8A is a diagram showing an atomic arrangement in a top surface of the group III nitride semiconductor having the (0001) plane as the main surface.
Figure 8C:
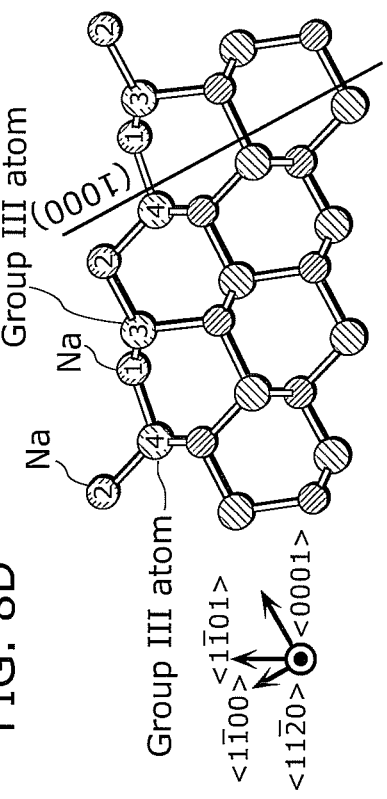
FIG. 8C is a diagram showing an atomic arrangement on a top surface of the group III nitride semiconductor having the (1-101) plane as the main surface.
Figure 8B:
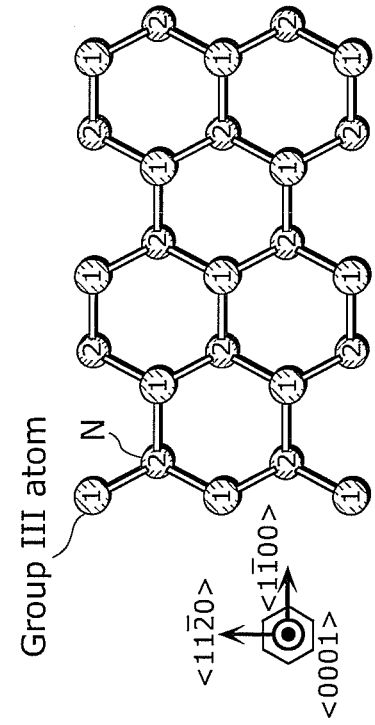
FIG. 8B is a diagram showing an atomic arrangement in a cross section of the group III nitride semiconductor having a (0001) plane as the main surface.
Figure 8D:
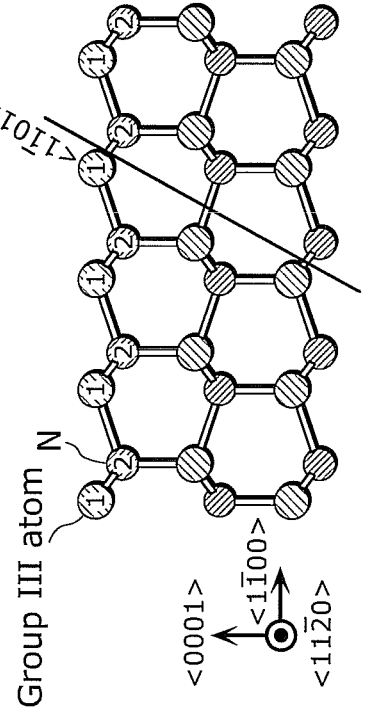
FIG. 8D is a diagram showing an atomic arrangement on a cross section of the group III nitride semiconductor having the (1-101) plane as the main surface.

Thus, in the case of using the organic nitrogen source such as NEt$_3$, the epitaxial growth of the InGaN layer is particularly promoted toward the (1-101) plane, thus allowing increasing flatness and decreasing the flow rate of NH$_3$. Thus, as described above, it can be considered that the epitaxial growth of the InGaN layer concomitantly using NEt$_3$ has a tendency exactly opposite to the tendency that is seen in the normal epitaxial growth using only $NH_3$. There is no clear answer to this significant difference, but it is possible to consider that the difference is caused by difference in atomic absorption in each plane. FIGS. 8A to 8D schematically show atomic arrangements in the (0001) plane and the (1-101) plane of the group III nitride semiconductor. FIG. 8A is a diagram showing an atomic arrangement in a top surface of a group III nitride semiconductor having the (0001) plane as the main surface, and FIG. 8B is a diagram showing an atomic arrangement in a cross section of the group III nitride semiconductor. Likewise, FIG. 8C is a diagram showing an atomic arrangement in a top surface of a group III nitride semiconductor having the (1-101) plane as the main surface, and FIG. 8D is a diagram showing an atomic arrangement in a cross section of the group III nitride semiconductor.

In the (0001) plane, a group III atom assigned with "1" is in a topmost surface (FIG. 8B), and an epitaxial growth of an upper layer is caused by a nitrogen atom being absorbed immediately above the group III atom. On the other hand, the (1-101) has a complex structure as compared to the (0001) plane. Specifically, the (1-101) plane has nitrogen atoms as topmost atoms (FIG. 8D), and nitrogen atoms are arranged in two types assigned with "1" and "2" in the figure. When epitaxial growth occurs therein, the group III atom should be absorbed first. Above the "1" nitrogen atom, a group III atom binds by a bond. That is, a structure is formed as seen in an N polar plane of the (000-1) plane. On the other hand, when the group III atom is absorbed above the nitrogen atom assigned with "2", the group III atom binds to an adjacent atom assigned with "2" in a bridge form. This results in an atomic arrangement as in the (001) plane in cubic GaN. Accordingly, it is possible to consider that the surface of the upper layer in the (1-101) plane has both the features of the (000-1) plane and the cubic (001) plane. In addition, when the group III atom is absorbed into the (1-101) plane, besides the atomic arrangement as described above, absorption occurs which interferes with the epitaxial growth. Specifically, the group III atom binds with two nitrogen atoms assigned with "1" and "2", and the group III atom is absorbed immediately above a group III atom assigned with "3". In this case, since the surface is terminated, atomic absorption does not continuously occur. This influence is particularly prominent in indium, and is a factor of low efficiency in indium incorporation into the (1-101) plane. On the other hand, from the result of the experiment on the epitaxial growth of the InGaN layer concomitantly using $NEt_3$, the indium incorporation efficiency in the slope has increased to the contrary. A possible cause of this is that such an undesirable absorption structure of indium in the (1-101) plane as described above is suppressed for some reason. It is possible to consider that there is a common mechanism for a selective sidewall growth using DMHy, and a key to such phenomena can be considered as carbon absorption into the surface or a surfactant effect of carbon in the surface.

Figure 9:
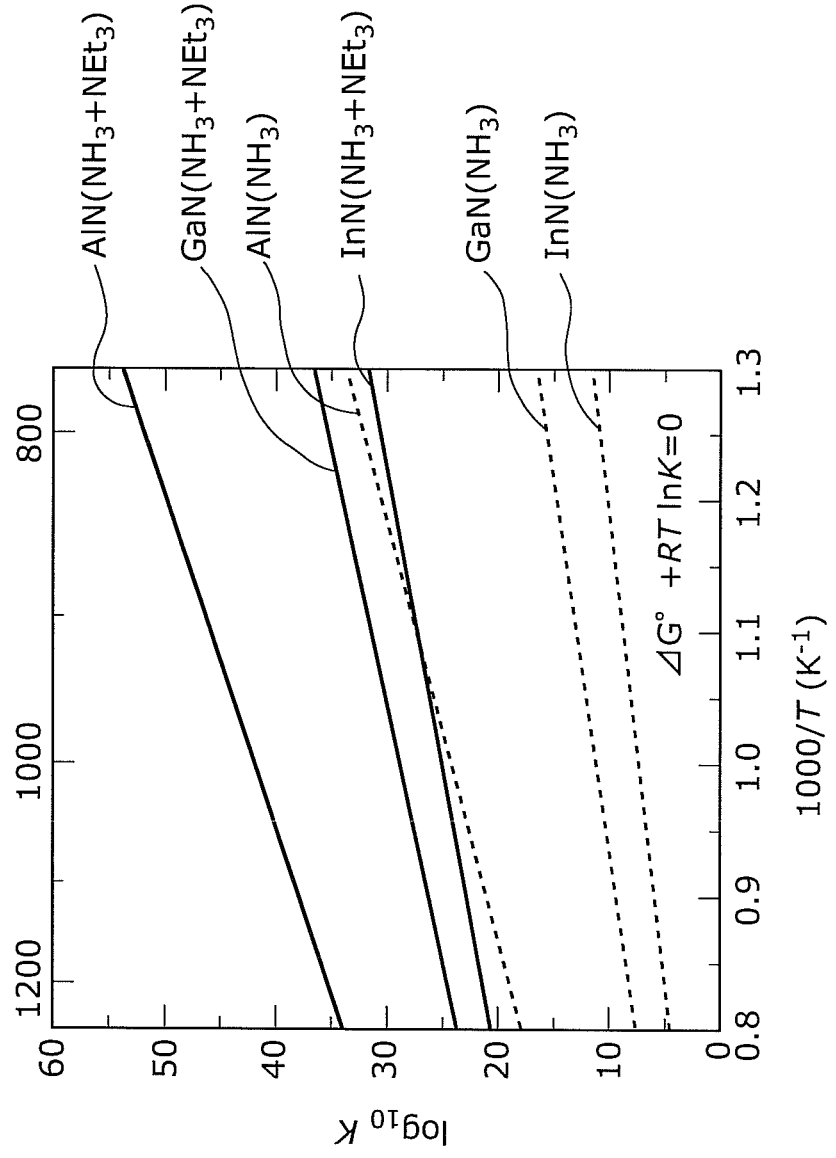
FIG. 9 is a diagram showing change in chemical equilibrium constant in each of a growth mode without concomitantly using $NEt_3$ and a growth mode concomitantly using $NEt_3$.

Next, in order to prove that epitaxially growing the InGaN layer concomitantly using $NEt_3$ increases the efficiency in indium incorporation in the (1-101) plane, variation in chemical equilibrium constant is observed. In FIG. 9, a dashed line represents variation in chemical equilibrium constant in the growth mode without concomitantly using $NEt_3$, which is represented by: group III atom+$NH_3$=group III nitride+(3/2)$H_2$, and a solid line represents variation in chemical equilibrium constant in the growth mode concomitantly using $NEt_3$ represented by: group III atom+$NH_3$+$NEt_3$=group III nitride+$3C_2H_6$+(½)$N_2$. In FIG. 9, a horizontal axis indicates temperature T, and a vertical axis indicates chemical equilibrium constant K which is represented by Expression 1 below, using free energy variation ΔG and gas constant R:

$$\Delta G + RT(\ln K) = 0 \qquad \text{Expression (1)}$$

As is clear from FIG. 9, in any one of the cases of generating AlN, GaN, and InN, use of $NEt_3$ increases the chemical equilibrium constant. Particularly in InN, the concomitant use of $NEt_3$ produces a significant growth-promoting effect which is comparable to the chemical equilibrium constant in AlN growth without concomitantly using $NEt_3$.

Such high reactivity can be described by high free energy of $NEt_3$. Specifically, when epitaxially growing a nitride semiconductor concomitantly using an organic nitrogen material such as $NEt_3$, $NEt_3$ having a high free energy is thermally decomposed, so that an ethyl radical is freed. Since this ethyl radical, which is unstable by itself, hits a hydrogen atom of $NH_3$. As a result, the hydrogen atom of $NH_3$ is stabilized as ethane ($C_2H_6$). On the other hand, $NH_2$ after desorption of one hydrogen atom is also unstable, and thus is further hit by the ethyl radical and gradually loses hydrogen. Then, finally, a nitrogen source that can contribute to nitride growth is formed and chemically bound to a group III atom, so that a nitride semiconductor is formed.

Figures 10A, 10B:
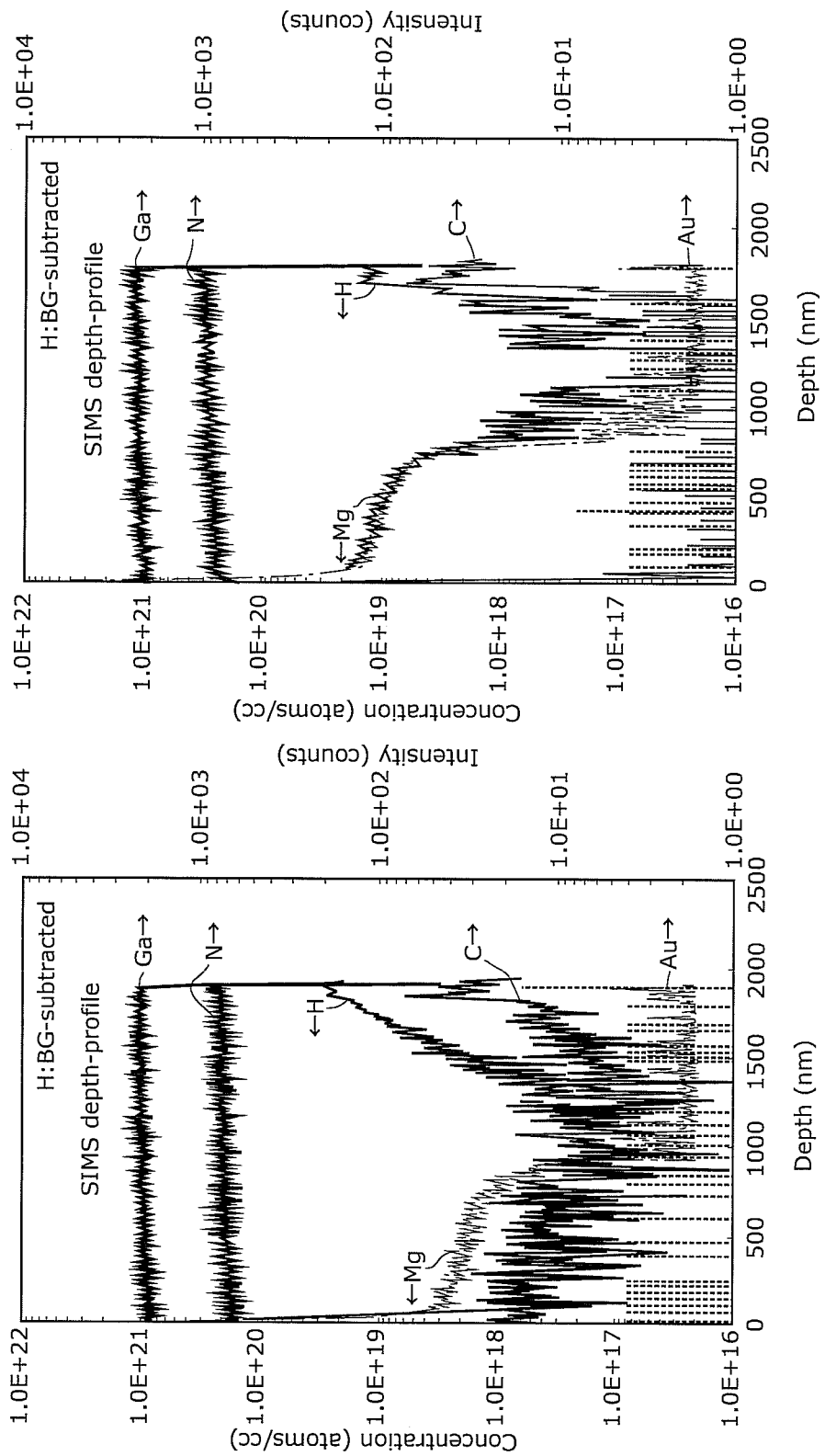
FIG. 10A is a diagram showing a distribution of each element concentration in a depth direction, in the nitride semiconductor that is epitaxially grown concomitantly using $NEt_3$.
FIG. 10B is a diagram showing a distribution of each element concentration in the depth direction, in the nitride semiconductor that is epitaxially grown without concomitantly using $NEt_3$.

Here, as described earlier, the ethyl radical, freed from $NEt_3$, is not stable and thus hits the hydrogen absorbed into the surface of the nitrides semiconductor as with the hydrogen atom of $NH_3$. Thus, the hydrogen concentration included in the nitride semiconductor decreases. On the other hand, since $NEt_3$ includes a large number of carbon atoms, there is a possibility that part of the carbons become free during a process of the heat decomposition of $NEt_3$. The freed carbon atoms are incorporated into the nitride semiconductor, to increase the carbon concentration. Therefore, the carbon concentration and hydrogen concentration in the nitride semiconductor differ between the cases of epitaxially growing the nitride semiconductor concomitantly using $NEt_3$ and epitaxially growing the nitride semiconductor without concomitantly using $NEt_3$. In order to prove this, the concentration of each element in the nitride semiconductor is studied. FIG. 10A is a diagram showing a distribution of each of concentrations of gallium, nitrogen, magnesium, gold, carbon, and hydrogen in a depth direction in the nitride semiconductor that is epitaxially grown concomitantly using $NEt_3$. FIG. 10B is a diagram showing a distribution of each of concentrations of gallium, nitrogen, magnesium, gold, carbon, and hydrogen in a depth direction in the nitride semiconductor that is epitaxially grown without concomitantly using $NEt_3$. In FIGS. 10A and 10B, a horizontal axis represents a depth from the surface of the nitride semiconductor, and a vertical axis represents the concentration of each element. It is to be noted that a sample used for the measurement is formed by: forming, by epitaxial growth, an undoped GaN layer having a thickness of 1 μm on a sapphire substrate, and further forming, on the undoped GaN layer, a p-type GaN layer having a thickness of approximately 0.8 μm.

As clearly shown in FIGS. 10A and 10B, the nitride semiconductor layer that is epitaxially grown concomitantly using $NEt_3$ has a higher carbon concentration and a lower hydrogen concentration than the nitride semiconductor that is epitaxially grown without concomitantly using $NEt_3$.

As described above, in the epitaxial growth of the InGaN layer concomitantly using $NEt_3$, our experiments and theoretical considerations have clarified that a plane direction that is other than the (0001) plane indicates a high efficiency in indium incorporation. The following will describe embodiments of a new nitride semiconductor device using such a phenomenon from our findings.

It is to be noted that in the embodiments above, the GaN layer as a first nitride semiconductor according to an implementation of the present invention has been described as having the (0001) plane and the (1-101) plane as a plane other than the (0001) plane, but the GaN layer may have planes (11-22), (1-102), and (11-24) as planes other than the (0001) plane.

In the case of exposing the (11-22) plane on the GaN layer, the GaN layer is formed according to the method described below. Specifically, on the substrate having the (0001) plane as the main surface, the (11-20) plane that is a plane perpendicular to the (0001) plane is exposed as a lateral wall using dry etching or the like. The case of exposing the (11-22) plane on the GaN layer is different from the case of exposing the (1-101) plane because, in exposing the (1-101) plane on the GaN layer, the (1-100) plane that is perpendicular to the (0001) plane is exposed, as a lateral wall, on the substrate having the (0001) plane as the main surface, using dry etching or the like. Next, the (11-22) plane is automatically formed on the GaN layer by epitaxially growing the GaN layer using an epitaxial growth condition which indicates a low growth rate of the (11-22) plane. In such epitaxial growth of the GaN layer, by reducing an amount of supply of group V elements and using only hydrogen for the carrier gas, unstable etching onto the slope surface is promoted to facilitate the exposure on the slope surface. In addition, a little low temperature is set for the growth temperature, so as to suppress the migration of group III elements in the surface. Furthermore, growth pressure is decreased, so as to promote desorption from the slope surface. As a specific growth condition, the growth temperature is set to 1000° C., the growth pressure is set to 200 Torr, and a $NH_3$/TMG ratio is set to approximately 1000. This epitaxial growth condition is the same as the growth condition for exposing the (1-101) plane on the GaN layer.

In the case of exposing the (1-102) plane and the (11-24) plane on the GaN layer, as a growth condition, the growth temperature is set to 1050° C., the growth pressure set to 200 Torr, the $NH_3$/TMG ratio is set to approximately 4000, and the carrier gas is set to include 90% hydrogen, and nitrogen for the rest.

In the case of exposing the (0001) plane in the GaN layer, in the epitaxial growth of the GaN layer, the etching onto the slope surface is suppressed by increasing the supply of group V elements and using nitrogen as part of the carrier gas, so as to obtain a flat surface. In addition, when using only nitrogen for the carrier gas, the level of desorption from the surface becomes too low and is likely to cause roughness in the surface: thus, hydrogen should be added to some extent. In addition, a little high temperature is set for the growth temperature so that the migration in the horizontal direction is promoted. When rising the temperature, nitride desorption from the surface increases; also for the purpose of supplementing this, the flow rate of $NH_3$ is concurrently raised. As a specific growth condition, the growth temperature is set to 1100° C., the growth pressure is set to 200 Torr, the $NH_3$/TMG ratio is set to approximately 8000, and the carrier gas is set to include approximately 80% hydrogen.

In addition, in the embodiments above, the InGaN layer as a second semiconductor according to an implementation of the present invention has conductivity, and the nitride semiconductor device may further include an electrode provided on and in contact with the InGaN layer. In this case, the InGaN layer functions as a contact layer with the electrode. The InGaN layer, even though having the impurity concentration is at the same level across the InGaN layer, has a higher indium composition and a narrower bandgap in the plane other than the (0001) plane, so that impurity activation energy decreases in the plane other than the (0001) plane, and thus results in a high carrier concentration. As a result, a nitride semiconductor with lower power consumption is realized.

In addition, in the embodiments above, a mixed gas of TMI and $NH_3$ has been described as a gas including nitrogen and indium and used for epitaxially growing the InGaN layer, but the gas is not limited to such an example.

First Example

Figure 11A:
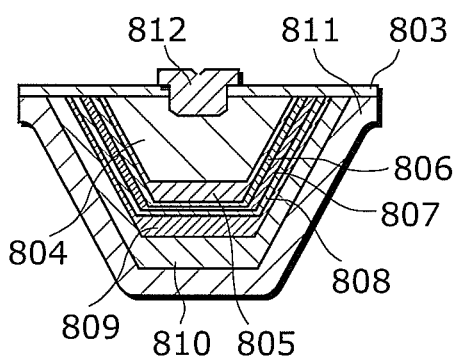
FIG. 11A is a cross-sectional diagram showing a structure of a nitride semiconductor light-emitting diode according to a first example of the present invention.

FIG. 11A is a cross-sectional view showing a structure of a nitride semiconductor light-emitting diode (light-emitting device) according to a first example of the present invention.

The nitride semiconductor light-emitting diode includes: an AlN layer 803; an n-type GaN layer 804; an undoped AlGaN layer 805; an undoped GaN layer 806; an InGaN/InGaN active layer (luminescent layer) 807; an undoped GaN layer 808; an undoped AlGaN layer 809; a p-type GaN layer 810; a p-side electrode 811; and an n-side electrode 812.

A through hole is formed in the AlN layer 803, and the n-side electrode 812 is embedded therein. A hole is formed in the GaN layer 804 to be continuous with the through hole in the AlN layer 803, and the n-side electrode 812 is likewise embedded therein.

The GaN layer 804 is provided to be convex downward, on the bottom surface of the AlN layer 803. More specifically, the GaN layer 804 is formed as a convex portion having a height of, for example, 6 μm, and the (0001) plane is automatically formed on the bottom surface of the GaN layer 804 and the (1-101) plane is automatically formed on the slope as a lateral surface as a result of epitaxial growth. The GaN layer 804 is formed into p-type using, for example, Si dopant, and having, for example, a Si concentration of $1 \times 10^{19}$ cm$^{-3}$.

The AlGaN layer 805 is an example of a third nitride semiconductor according to an implementation of the present invention, and is provided opposite to the active layer 807 with respect to the GaN layer 806. The AlGaN layer 805 has a thickness that is different between the <0001> direction in a portion that contacts the (0001) plane of the GaN layer 804 and the <1-101> direction in a portion that contacts the (1-101) plane of the GaN layer 804, and the thickness is greater in the portion that contacts the (0001) plane and smaller in the portion that contacts the (1-101) plane. For example, the AlGaN layer 805 is as thick as approximately 10 nm in the portion that contacts the (0001) plane, and is as thin as approximately 2 nm in the portion that contacts the (1-101) plane.

The GaN layer 806 is an example of the first nitride semiconductor according to an implementation of the present invention, and is provided on the AlGaN layer 805 to cover the surface of the AlGaN layer 805. The bottom surface of the GaN layer 806 is (0001) plane, and the slope as a lateral surface of the GaN layer 806 is (1-101) plane.

The active layer 807 is an example of the second nitride semiconductor according to an implementation of the present invention, and is provided on the GaN layer 806 to cover the surface of the GaN layer 806. The active layer 807 has a thickness that is different between the <0001> direction in the portion that contacts the (0001) plane of the GaN layer 806 and the <1-101> direction in the portion that contacts the (1-101) plane of the GaN layer 806. In other words, the active layer 807 has a greater thickness in the portion that contacts the (1-101) plane than in the portion that contacts the (0001) plane.

The active layer 807 is provided, for example, in 10 pairs, and the thickness thereof is designed such that the luminescence wavelength becomes a pure blue wavelength of 470 nm. The active layer 807 has a higher indium composition ratio in the portion that contacts the (1-101) plane of the GaN layer 806 than in the portion that contacts the (0001) plane of the GaN layer 806.

The GaN layer 808 is an example of a fourth nitride semiconductor according to an implementation of the present invention, and is provided between and in contact with the AlGaN layer 809 and the active layer 807. The GaN layer 808 has a (0001) plane as a bottom surface, and has a plane other than the (0001) plane at the slope as a lateral surface of the convex portion.

The AlGaN layer 809 is an example of a third nitride semiconductor according to an implementation of the present invention, and is provided opposite to the GaN layer 806 with respect to the active layer 807. The AlGaN layer 809 has a thickness that is different between the <0001> direction in a portion that contacts the (0001) plane of the GaN layer 808 and the <1-101> direction in a portion that contacts the (1-101) plane of the GaN layer 808, and the thickness is greater in the portion that contacts the (0001) plane and smaller in the portion that contacts the (1-101) plane. For example, the AlGaN layer 809 is as thick as approximately 10 nm in the portion that contacts the (0001) plane, and is as thin as approximately 2 nm in the portion that contacts the (1-101) plane.

The GaN layer 810 is provided on the AlGaN layer 809 to cover the surface of the AlGaN layer 809. The GaN layer 810 has a film thickness of, for example, 200 nm in the <0001> direction. As the dopant for forming the GaN layer 810 into p-type, biscyclopentadienylmagnesium is used, for example.

The p-side electrode 811 is an electrode formed using, for example, Ni/Pi/Au as an electrode metal, and is provided on the GaN layer 810 to cover the surface of the GaN layer 810. The n-side electrode 812 is an electrode formed using, for example, Ti/Au as an electrode metal.

Figure 11B:
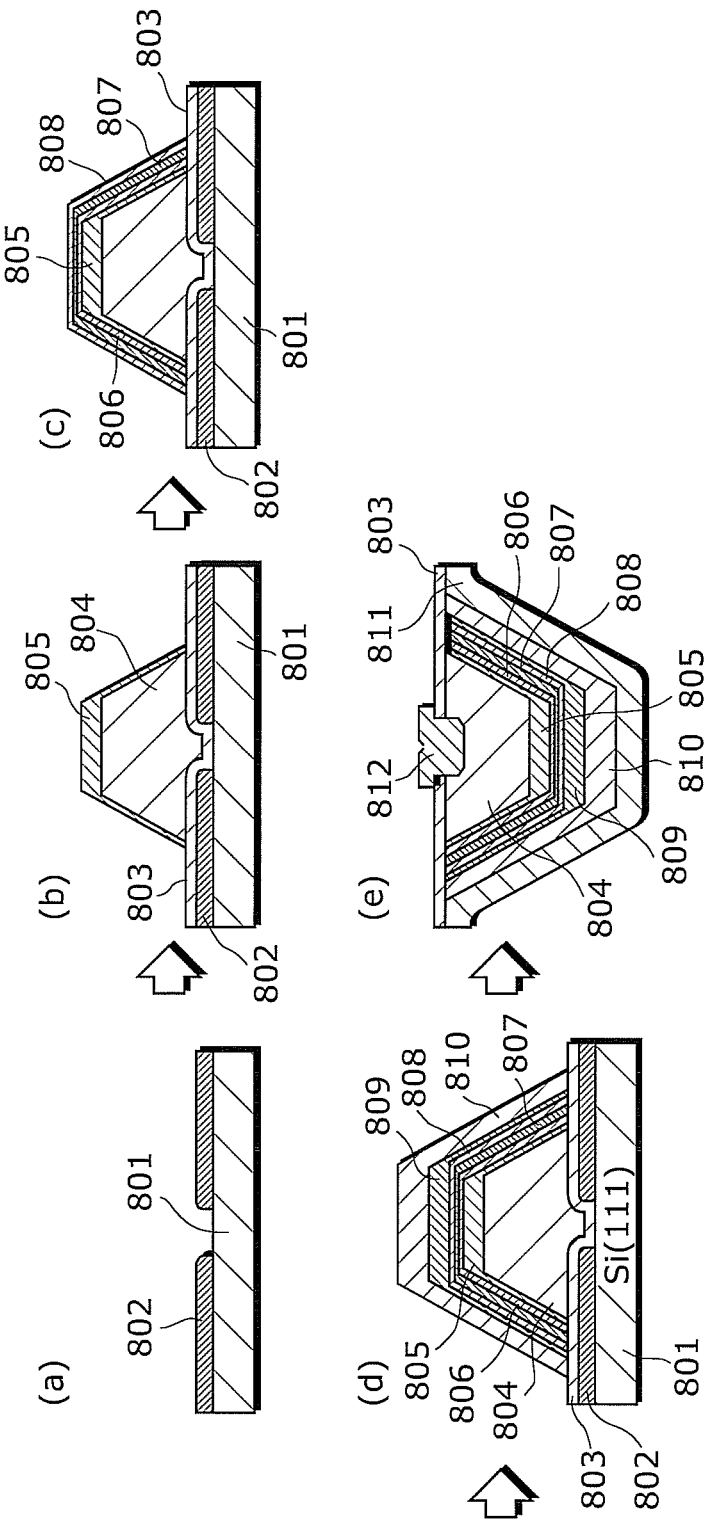
FIG. 11B is a cross-sectional view for describing a method of manufacturing the nitride semiconductor light-emitting diode.

Next, a method of manufacturing the nitride semiconductor light-emitting diode having the structure above will be described. FIG. 11B is a cross-sectional view for describing the method of manufacturing the nitride semiconductor light-emitting diode.

First, as shown in FIG. 11B(a), a SiO$_2$ film 802 having a thickness of 200 nm is deposited in the (111) plane of the silicon substrate 801, and is patterned, after the process as described in FIG. 2(a), so as to form a stripe window. The stripe window has a width of 4 μm. Here, the stripe window is formed in a direction perpendicular to the drawing sheet and in parallel with the <11-20> direction.

Next, the silicon substrate 801 is placed in the MOCVD furnace, and as shown in FIG. 11B(b), epitaxial growth is performed on the silicon substrate 801. In this processing, only NH$_3$ is used as the N material (nitrogen source). Specifically, after epitaxially growing the AlN layer 803 having a thickness of 150 nm at 1100° C., the GaN layer 804 is epitaxially grown. The epitaxial growth of the GaN layer 804 uses the silane gas as Si dopant, and the flow rate of the silane gas is controlled such that the Si concentration is $1 \times 10^{19}$ cm$^{-3}$ in the GaN layer 804.

Next, as shown in FIG. 11B(b), the AlGaN layer 805 having an Al composition of, for example, 25% is epitaxially grown.

Next, as shown in FIG. 11B(c), epitaxial growth around the active layer 807 is performed. Specifically, after epitaxially growing the GaN layer 806 having a thickness of 20 nm, the active layer 807 is epitaxially grown, and further the GaN layer 808 having a thickness of 20 nm is epitaxially grown. In this processing, for the nitrogen material, NEt$_3$ is used concomitantly with NH$_3$. The flow rate of NEt$_3$ is controlled to be 0.5 to 2% of the flow rate of NH$_3$. Subsequently, the supply of NEt$_3$ is stopped, to switch to the growth mode using only NH$_3$. Then, as shown in FIG. 11B(d), the semiconductor layer structure on the p-side is formed by epitaxial growth. Specifically, after epitaxially growing the AlGaN layer 809 having a composition of 25%, the GaN layer 810 is epitaxially grown.

Next, after termination of the epitaxial growth of the GaN layer 810, the silicon substrate 801 is taken out from the MOCVD furnace after the temperature falls, and the processing moves on to an electrode formation process as shown in FIG. 11B(e). Specifically, first, the p-side electrode 811 is evaporated onto the entire surface of the silicon substrate 801, from the side of the plane on which the epitaxial growth has been performed. Then, gas-phase etching using ClF$_3$ gas is performed on the silicon substrate 801, to completely remove the silicon substrate 801. In this processing, the SiO$_2$ film 802 is removed together. Subsequently, after forming a hole, using the exposure method and chlorine-based dry etching, in part of the AlN layer 803 and the GaN layer 804, the n-side electrode 812 is formed therein.

Here, the method of manufacturing the nitride semiconductor light-emitting diode includes: a process of epitaxially growing the nitride semiconductor using a gas not additionally including NEt$_3$ as in the forming of the AlN layer 803, the GaN layer 804, the AlGaN layer 805, the AlGaN layer 809, and the GaN layer 810; and a process of epitaxially growing the nitride semiconductor using a gas additionally including NEt$_3$ as in the forming of the GaN layer 806, the active layer 807, and the GaN layer 808. Then, the nitride semiconductor that is epitaxially grown using the gas additionally including NEt$_3$ is either higher in carbon concentration or lower in hydrogen concentration than the nitride semiconductor that is epitaxially grown using the gas not additionally including NEt$_3$.

As described above, according to the nitride semiconductor light-emitting diode in the present example, the active layer 807, which has a high indium composition and can be luminescent in blue, is formed above the (1-101) plane that is a slope. Since less polarization occurs in the active layer 807 formed above the (1-101) plane than in the activate layer 807 formed above the (0001) plane, rebinding of the electrons and holes in the active layer 807 is efficiently promoted. As a result, it is possible to increase luminescence efficiency.

In addition, as is clear from the result of the CL measurement described earlier, the active layer 807 formed above the (1-101) plane has an indium composition that is too high to be solved by the normal epitaxial growth using only NH$_3$. Thus, according to the nitride semiconductor light-emitting diode in the present example, it is possible to easily form the active layer 807 that can be luminescent at a longer wavelength at high temperature.

In addition, according to the nitride semiconductor light-emitting diode in the present example, the AlGaN layers 805 and 809 are thick in the portion formed above the (0001) plane, which makes it difficult to inject the current beyond the portion. In other words, the AlGaN layers 805 and 809 function as the current blocking layers, directing the current to efficiently flow into the active layer 807 above the (1-101) plane. For this reason, it is possible to increase luminescence efficiency.

In addition, according to the nitride semiconductor light-emitting diode in the present example, the p-side electrode 811 completely covers the entire p-side semiconductor structure, and luminescence is extracted from the side of the silicon substrate 801. In addition, the cross section of the light-emitting diode is mesa-shaped. Accordingly, it is possible to realize a light-emitting diode having a high light-extraction efficiency.

In addition, according to the nitride semiconductor light-emitting diode in the present example, an edge of the active layer 807 is terminated with the AlN layer 803, thus allowing removal of influences such as oxygen in ambient air. This allows realizing a light-emitting diode that suppresses aging.

In the present example, the luminescent layer has been described as including, as the InGaN/InGaN active layer, a well layer and a barrier layer both of which are made of InGaN, but different materials may be used for the well layer and the barrier layer, respectively, such as an InGaN/GaN active layer or an InGaN/InAlGaN active layer. In other words, any configuration is possible as long as the luminescent layer includes a layer including In.

Second Example

Figure 12A:
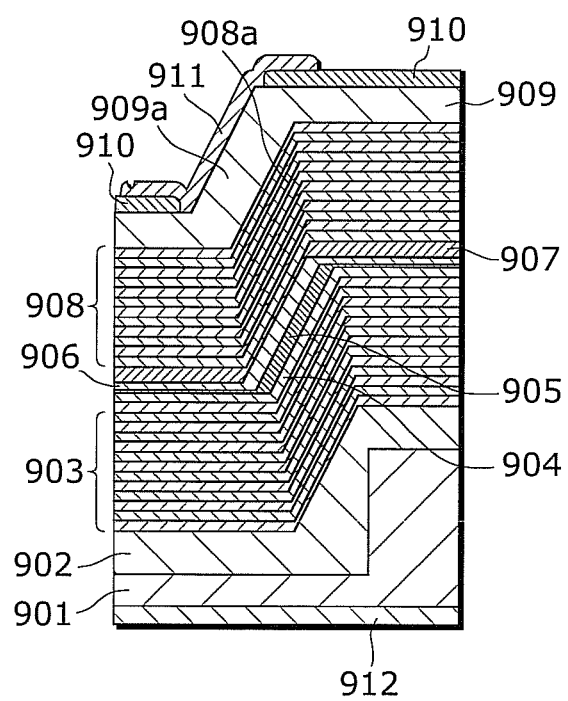
FIG. 12A is a cross-sectional diagram showing a structure of a nitride semiconductor laser element according to a second example of the present invention.

FIG. 12A is a cross-sectional view showing a structure of a nitride semiconductor laser element (light-emitting device) according to a second example of the present invention.

The nitride semiconductor laser element includes: a GaN free-standing substrate 901; an n-type GaN layer 902; an n-type AlGaN/GaN superlattice layer 903; an undoped GaN layer 904; an InGaN/InGaN multiquantum well active layer (luminescent layer) 905; an undoped GaN layer 906; an overflow suppression (OFS) layer 907; a p-type AlGaN/GaN superlattice layer 908; a p-type GaN layer 909; a SiO$_2$ film 910; a p-side electrode 911; and an n-side electrode 912.

The GaN free-standing substrate 901 is a substrate having a carrier concentration of $10^{19}$ cm$^{-3}$ and having an n-type conductivity, and a step of 1.8 μm, for example, is formed in the (0001) plane of the substrate. It is to be noted that in FIG. 12A, the GaN free-standing substrate 901 is illustrated resembling the drawing sheet as the (1-100) plane.

The GaN layer 902 is formed to cover the lateral surface of the step of the GaN free-standing substrate 901, and has a step reflecting the shape of the GaN free-standing substrate 901. The (0001) plane is automatically formed on top of the GaN layer 902 by epitaxial growth, and the (11-22) plane is automatically formed by epitaxial growth, on the slope as the lateral surface of the step of the GaN layer 902.

The AlGaN/GaN superlattice layer 903 is an example of the third nitride semiconductor according to an implementation of the present invention, and is provided opposite to the InGaN/InGaN multiquantum well active layer 905 with respect to the GaN layer 904. The AlGaN/GaN superlattice layer 903 is formed to cover the lateral surface of the step of the GaN layer 902, and has a step reflecting a shape of the GaN layer 902. The AlGaN/GaN superlattice layer 903 has a periodic structure in which a plurality of layers each of which includes aluminum are periodically stacked, and has a longer period in the portion that contacts the (0001) plane of the GaN layer 902 than in the portion that contacts the (11-22) plane of the GaN layer 902. In other words, each AlGaN included in the AlGaN/GaN superlattice layer 903 has a greater thickness in the <0001> direction in the portion that contacts the (0001) plane than in the <11-22> direction in the portion that contacts the (11-22) plane. For example, the AlGaN layer is as thick as approximately 5 nm in the portion that contacts the (0001) plane, and is as thin as approximately 1 nm in the portion that contacts the (11-22) plane. On the other hand, the GaN included in the AlGaN/GaN superlattice layer 903 has an equal thickness between the <11-22> direction in the portion that contacts the (11-22) plane and the <0001> direction in the portion that contacts the (0001) plane, and the thickness is, for example, approximately 20 nm. The aluminum composition of the AlGaN/GaN superlattice layer 903 is, for example, 10%, and only GaN is assumed as having an n-type conductivity (Si concentration $10^{19}$ cm$^{-3}$).

The GaN layer 904, which is an example of the first nitride semiconductor according to an implementation of the present invention, is formed to cover the lateral surface of the step of the AlGaN/GaN superlattice layer 903, and has a step reflecting the shape of the AlGaN/GaN superlattice layer 903. The top surface of the GaN layer 904 is (0001) plane, and the slope as the lateral surface of the step of the GaN layer 904 is (11-22) plane. The GaN layer 904 has a film thickness of, for example, 20 nm.

The InGaN/InGaN multiquantum well active layer 905, which is an example of the second nitride semiconductor according to an implementation of the present invention, is formed to cover the lateral surface of the step of the GaN layer 904, and has a step reflecting the shape of the GaN layer 904. The InGaN/InGaN multiquantum well active layer 905 has a thickness that is different between the portion that contacts the (0001) plane of the GaN layer 904 and the portion that contacts the (11-22) plane of the GaN layer 904. Specifically, the InGaN/InGaN multiquantum well active layer 905 has a greater thickness in the <11-22> direction in the portion that contacts the (11-22) plane than in the <0001> direction in the portion that contacts the (0001) plane. The InGaN/InGaN multiquantum well active layer 905 is, for example, active layers provided in 3 pairs.

The InGaN/InGaN multiquantum well active layer 905 has a higher indium composition ratio in the portion that contacts the (11-22) plane of the GaN layer 806 than in the portion that contacts the (0001) plane of the GaN layer 904.

The GaN layer 906 is provided between and in contact with both the InGaN/InGaN multiquantum well active layer 905 and the OFS layer 907. The top surface of the GaN layer 906 is (0001) plane, and the slope as the lateral surface of the step of the GaN layer 906 is (11-22) plane. The GaN layer 906 has a film thickness of, for example, 20 nm.

The OFS layer 907, which is an example of the third nitride semiconductor according to an implementation of the present invention, is provided opposite to the GaN layer 904 with respect to the InGaN/InGaN multiquantum well active layer 905. The OFS layer 907 includes undoped AlGaN having an aluminum composition of, for example, 20%. The OFS layer 907 has a thickness that is different between the portion that contacts the (0001) plane of the GaN layer 906 and the portion that contacts the (11-22) plane of the GaN layer 906. Specifically, the OFS layer 907 has a smaller thickness in the <11-22> direction in the portion that contacts the (11-22) plane than in the <0001> direction in the portion that contacts the (0001) plane. For example, the OFS layer 907 is as thick as approximately 25 nm in the portion that contacts the (0001) plane, and is as thin as approximately 5 nm in the portion that contacts the (11-22) plane.

The AlGaN/GaN superlattice layer 908, which is an example of the third nitride semiconductor according to an implementation of the present invention, is provided opposite to the GaN layer 904 with respect to the InGaN/InGaN multiquantum well active layer 905.

The AlGaN/GaN superlattice layer 908 is a periodic structure in which a plurality of layers each of which includes aluminum are periodically stacked, and has a period that is different between the portion located above the (0001) plane of the GaN layer 906 (the portion of the AlGaN/GaN superlattice layer 908 epitaxially grown in the <0001> direction), and the portion located above the (11-22) plane of the GaN layer 906 (the portion of the AlGaN/GaN superlattice layer 908 epitaxially grown in the <11-21> direction). Specifically, the AlGaN included in the AlGaN/GaN superlattice layer 908 has a longer period in the portion located above the (0001) plane than in the portion located above the (11-22) plane. Accordingly, the AlGaN/GaN superlattice layer 908 has a thickness that is different between the portion located above the (0001) plane and the portion located above the (11-22) plane. Specifically, the AlGaN included in the AlGaN/GaN superlattice layer 908 has a smaller thickness in the <11-22> direction in the portion located above the (11-22) plane than in the <0001> direction in the portion located above the (0001) plane. For example, the AlGaN layer is as thick as approximately 10 nm in the portion located above the (0001) plane, and is as thin as approximately 2 nm in the portion located above the (11-22) plane. On the other hand, the GaN included in the AlGaN/GaN superlattice layer 908 has an equal thickness between the <11-22> direction in the portion located above the (11-22) plane of the GaN layer 904 and the <0001> direction in the portion located above the (0001) plane of the GaN layer 904, and the thickness is, for example, approximately 20 nm.

The aluminum composition of the AlGaN/GaN superlattice layer 908 is, for example, 10%.

The GaN included in the AlGaN/GaN superlattice layer 908 includes carbon as an impurity, and is assumed as having a p-type conductivity. In addition, the GaN included in the AlGaN/GaN superlattice layer 908 has a higher carbon concentration in the portion located above the (0001) plane than in the portion located above the (11-22) plane, and the carbon concentration in the portion located above the (11-22) plane is assumed as $1 \times 10^{18}$ cm$^{-3}$. Such setting of the carbon concentration allows the GaN located above the (11-22) plane to effectively function as a p-type layer.

The GaN layer 909 is formed to cover the lateral surface of the step of the GaN layer 906, and has a step reflecting the shape of the GaN layer 906.

The p-side electrode 911 is an electrode formed using, for example, Ni/Pt/Au as an electrode metal, and is embedded in an aperture of the SiO$_2$ film 910, in contact with the GaN layer 909. The n-side electrode 912 is an electrode formed using, for example, Ti/Au as an electrode metal, and is provided above the GaN free-standing substrate 901.

Next, a method of manufacturing the nitride semiconductor laser element having the structure above will be described. FIG. 12B is a cross-sectional view for describing the method of manufacturing the nitride semiconductor laser element.

First, as shown in FIG. 12B(a), a step is formed in the GaN free-standing substrate 901 by chlorine-based dry etching.

Next, as shown in FIG. 12B(b), the GaN free-standing substrate 901 is carried into the MOCVD furnace, and epitaxial growth using only NH$_3$ is performed on the (0001) plane of the GaN free-standing substrate 901. In other words, after epitaxially growing the GaN layer 902 first, the AlGaN/GaN superlattice layer 903 is epitaxially grown. In this epitaxial growth, as compared to the normal growth condition, a mixture ratio of nitrogen gas in the carrier gas is increased while concurrently increasing the NH$_3$ flow rate.

Next, a flow of NEt$_3$ is introduced into the MOCVD furnace, to switch the mode to the NEt$_3$ growth mode. Here, the flow rate of the NEt$_3$ is set to 2% of the NH$_3$ flow rate. Then, as shown in FIG. 12B(c), after growing the GaN layer 904, the InGaN/InGaN multiquantum well active layer 905 is epitaxially grown, and further the GaN layer 906 is epitaxially grown.

Next, the introduction of NEt$_3$ into the MOCVD furnace is stopped, to shift the mode back to the growth mode using only NH$_3$. Then, as shown in FIG. 12B(d), after epitaxially growing the OFS layer 907, the p-type AlGaN/GaN superlattice layer 908 is epitaxially grown. Here, the p-type dopant is carbon, and carbon tetrabromide is used as a nitrogen source. The carbon is added to both the AlGaN and GaN included in the AlGaN/GaN superlattice layer 908, at a carbon concentration of $10^{18}$ cm$^{-3}$. The p-type GaN layer 909 that is carbon-doped is continuously epitaxially grown. In this processing, tetrabromide is also used as dopant at a carbon concentration of $10^{19}$ cm$^{-3}$.

Here, for behavior of carbons as dopant in the AlGaN/GaN superlattice layer 908 and the GaN layer 909, carbon atoms are likely to enter a gallium site as well as a nitrogen site in the (0001) plane. However, unlike the atomic arrangement in the (0001) plane, planes such as the (1-101) plane and the (11-22) plane, as shown earlier in FIGS. 8A to 8D, have atomic arrangements in which nitrogen atoms are arranged in the topmost surface, so that the carbons are preferentially added to the nitrogen site. In other words, a shortage of one electron causes a carbon atom to effectively function as an acceptor. On the other hand, the carbon-doped AlGaN and GaN in the (0001) plane have low site controllability and thus represent high insulation properties. Thus, in the AlGaN/GaN superlattice layer 908 and the GaN layer 909, regions 908a and 909b each of which has a high p-conductivity are formed during one epitaxial growth.

Next, after termination of the epitaxial growth, the GaN free-standing substrate 901 is taken out from the MOCVD furnace, and the processing moves on to an electrode formation process as shown in FIG. 12B(e). Specifically, an aperture is formed in the SiO$_2$ film 910 by: forming the SiO$_2$ film 910 on a wafer surface first, and then forming the aperture, using the exposure method and hydrofluoric acid, in the SiO$_2$ film 910 above the (11-22) plane that is a slope of the GaN layer 906. Next, a p-side electrode 911 is evaporated onto the aperture of the SiO$_2$ film 910. In addition, an n-side electrode 912 is evaporated onto the back surface of the GaN free-standing substrate 901. Lastly, a reflecting surface of a laser resonator is formed by cleaving the GaN free-standing substrate 901 along the <1-100> direction that is parallel to the drawing sheet of FIG. 12B(e).

Here, the method of manufacturing the nitride semiconductor laser element includes: a process of epitaxially growing the nitride semiconductor using a gas not additionally including NEt$_3$ as in the forming of the GaN layer 902, the AlGaN/GaN superlattice layer 903, the OFS layer 907, the p-type AlGaN/GaN superlattice layer 908, and the GaN layer 909; and a process of epitaxially growing the nitride semiconductor using a gas additionally including NEt$_3$ as in the forming of the GaN layer 904, the InGaN/InGaN multiquantum well active layer 905, and the GaN layer 906. Then, the nitride semiconductor that is epitaxially grown using the gas additionally including NEt$_3$ is either higher in carbon concentration or lower in hydrogen concentration than in the nitride semiconductor that is epitaxially grown using the gas not additionally including NEt$_3$.

As described above, according to the nitride semiconductor laser element in the present example, since the InGaN/InGaN multiquantum well active layer 905 is formed above the (11-22) plane, less polarization occurs in the InGaN/InGaN multiquantum well active layer 905. As a result, it is possible to increase luminescence efficiency.

In addition, according to the nitride semiconductor laser element in the present example, the selective growth of the InGaN into a particular plane direction through concomitant use of NEt$_3$ results in a higher indium composition ratio of the InGaN/InGaN multiquantum well active layer 905 above the (11-22) plane. As a result, it is possible to realize a laser element that can be luminescent at a longer wavelength.

In addition, according to the nitride semiconductor laser element in the present example, the InGaN/InGaN multi-quantum well active layer 905 above the (11-22) plane becomes luminescent at a longer wavelength. As a result, it is possible to realize a laser element which has a high refractive index and can efficiently perform optical confinement.

In addition, according to the nitride semiconductor laser element in the present example, the AlGaN/GaN superlattice layers 903 and 908 are grown such that a spatial average composition ratio of aluminum is smaller in the (11-22) plane than in the (0001) plane. Accordingly, the AlGaN/GaN superlattice layers 903 and 908 have a higher refractive index in the (11-22) plane than in the (0001) plane. As a result, it is possible to efficiently confine the light in the InGaN/InGaN multiquantum well active layer 905 above the (11-22) plane.

In addition, according to the nitride semiconductor laser element in the present example, the AlGaN/GaN superlattice layers 903 and 908, in the (0001) plane, due to having a longer period and accordingly a greater thickness, has poor electron-hole conductivity in a vertical direction. On the other hand, due to having the superlattice structure, the AlGaN/GaN superlattice layers 903 and 908 have higher conductivity in a horizontal direction, thus allowing introduction of electrons and holes into the InGaN/InGaN multiquantum well active layer 905 above the (11-22) plane. Then, the OFG layer 907, being very thick in the (0001) plane, functions as a current blocking layer while performing a function to return, to the InGaN/InGaN multiquantum well active layer 905, electrons overflowing from the InGaN/InGaN multiquantum well active layer 905 above the (11-22) plane. In addition, in the AlGaN/GaN superlattice layer 908 and the GaN layer 909, the regions 908a and 909a under site substitution control represent high p-type conductivity, while the portion above the (0001) plane represents high insulation properties, so that a current narrowing structure is formed by the AlGaN/GaN superlattice layer 908 and the GaN layer 909. Accordingly, since this structure allows an efficient flow of electrons and holes into the InGaN/InGaN multiquantum well active layer 905 in the (11-22) plane, it is possible to efficiently convert injected current into light.

In addition, according to the nitride semiconductor laser element in the present example, an effective width of the InGaN/InGaN multiquantum well active layer 905 is approximately determined by an etching height of the step of the GaN free-standing substrate 901. Thus, it is not necessary to perform etching after epitaxial growth as required for a ridge optical waveguide. Since an influence of an error in etching height on a light output angle has a greater margin than the influence on an etching depth of the ridge optical waveguide, it is possible to increase a yield.

In the present example, the luminescent layer has been described as including, as the InGaN/InGaN active layer, a well layer and a barrier layer both of which are made of InGaN, but different materials may be used for the well layer and the barrier layer, such as an InGaN/GaN active layer or an InGaN/InAlGaN active layer. In other words, any configuration is possible as long as the luminescent layer includes a layer including In.

In the present example, the nitride semiconductor laser element has been described as including an AlGaN/GaN superlattice structure as a superlattice layer (the AlGaN/GaN superlattice layers 903 and 908), but may include an AlGaN/AlGaN superlattice structure as the superlattice layer. In this case, it is preferable that one of the Al compositions be set to 10%, and the other of the Al compositions be set to below 1%.

By thus setting the aluminum composition, it is possible to largely reduce dislocation and distortion with respect to the (11-22) plane, thus making it possible to realize a highly efficient and high-brightness nitride semiconductor laser element.

Thus far, the nitride semiconductor device according to the present invention has been described based on some embodiment, but the present invention is not limited to these embodiments. Although only an exemplary embodiment of this invention have been described in detail above, those skilled in the art will readily appreciate that many modifications are possible in the exemplary embodiment without materially departing from the novel teachings and advantages of this invention. Accordingly, all such modifications are intended to be included within the scope of this invention.

INDUSTRIAL APPLICABILITY

The present invention is applicable to a nitride semiconductor device, and is particularly applicable to a high-brightness illumination source, a liquid crystal backlight, and further to an outdoor display and so on.

What is claimed is:

1. A nitride semiconductor device comprising:
   a first nitride semiconductor including a (0001) plane and a plane other than the (0001) plane; and
   a second nitride semiconductor that contacts said first nitride semiconductor and includes indium,
   wherein said second nitride semiconductor has a higher indium composition ratio in a portion that contacts the plane other than the (0001) plane than in a portion that contacts the (0001) plane.

2. The nitride semiconductor device according to claim 1, wherein said second nitride semiconductor has a greater thickness in the portion that contacts the plane other than the (0001) plane than in the portion that contacts the (0001) plane.

3. The nitride semiconductor device according to claim 1, wherein the plane other than the (0001) plane is one of a (1-101) plane, a (11-22) plane, a (1-102) plane, and a (11-24) plane.

4. The nitride semiconductor device according to claim 1, wherein said nitride semiconductor device is a light-emitting device including said second nitride semiconductor as a luminescent layer.

5. The nitride semiconductor device according to claim 4, further comprising:
   a third nitride semiconductor including aluminum and provided either opposite to said first nitride semiconductor with respect to said second nitride semiconductor or opposite to said second nitride semiconductor with respect to said first nitride semiconductor,
   wherein said third nitride semiconductor has a greater thickness in a portion located above the (0001) plane than in a portion located above the plane other than the (0001) plane.

6. The nitride semiconductor device according to claim 5, wherein said light-emitting device is a laser element,
   said third nitride semiconductor has a periodic structure in which a plurality of layers including aluminum are periodically stacked, and
   the periodic structure of said third nitride semiconductor has a longer period in the portion located above the (0001) plane than in the portion located above the plane other than the (0001) plane.

7. The nitride semiconductor device according to claim 6, wherein said third nitride semiconductor has a higher carbon concentration in the portion located above the plane other than the (0001) plane than in the portion located above the (0001) plane.

8. The nitride semiconductor device according to claim 6, wherein the periodic structure includes a layer having an aluminum content below 1%.

9. The nitride semiconductor device according to claim 1, wherein said second semiconductor has conductivity, and said nitride semiconductor device further comprises an electrode provided on and in contact with said second nitride semiconductor.

* * * * *